United States Patent
Mimura

(10) Patent No.: US 12,463,071 B2
(45) Date of Patent: *Nov. 4, 2025

(54) DEPOSITION APPARATUS, ELECTRONIC DEVICE MANUFACTURING APPARATUS, AND DEPOSITION METHOD

(71) Applicant: Canon Tokki Corporation, Mitsuke (JP)

(72) Inventor: Takuhei Mimura, Kawasaki (JP)

(73) Assignee: CANON TOKKI CORPORATION, Mitsuke (JP)

( * ) Notice: Subject to any disclaimer, the term of this patent is extended or adjusted under 35 U.S.C. 154(b) by 903 days.

This patent is subject to a terminal disclaimer.

(21) Appl. No.: 16/711,572

(22) Filed: Dec. 12, 2019

(65) Prior Publication Data

US 2020/0189054 A1 Jun. 18, 2020

(30) Foreign Application Priority Data

Dec. 14, 2018 (JP) ................................ 2018-234923

(51) Int. Cl.
*H01L 21/677* (2006.01)
*C23C 14/04* (2006.01)
(Continued)

(52) U.S. Cl.
CPC ...... *H01L 21/67709* (2013.01); *C23C 14/042* (2013.01); *C23C 14/54* (2013.01);
(Continued)

(58) Field of Classification Search
None
See application file for complete search history.

(56) References Cited

U.S. PATENT DOCUMENTS 4,825,773 A * 5/1989 Morishita ............... B60L 13/08
318/135
5,641,054 A * 6/1997 Mori ................. H01L 21/67184
198/465.1

(Continued)

FOREIGN PATENT DOCUMENTS

CN 102177270 A 9/2011
CN 102867924 A 1/2013
(Continued)

OTHER PUBLICATIONS

Office Action issued in Japanese Appln. No. 2018-234923 mailed Nov. 1, 2022. English translation provided.

(Continued)

*Primary Examiner* — Karla A Moore
(74) *Attorney, Agent, or Firm* — ROSSI, KIMMS & McDOWELL LLP

(57) ABSTRACT

A deposition apparatus includes a transport mechanism including a transport carrier which holds and transports a substrate and transport modules which constitute a transport path through which the transport carrier moves, an alignment chamber in which the substrate held by the transport carrier is loaded and a mask is positioned and fixed to the loaded substrate, a deposition chamber in which the substrate held by the transport carrier is loaded from the alignment chamber and deposition materials are deposited on the loaded substrate, and control means which controls a magnetic force generated between a plurality of magnets arranged in the transport carrier in a transport direction of the substrate and a plurality of coils arranged to face the plurality of magnets in each transport module by applying a current or a voltage to the plurality of coils.

15 Claims, 14 Drawing Sheets

(51) Int. Cl.

| | | |
|---|---|---|
| *C23C 14/54* | (2006.01) | |
| *C23C 14/56* | (2006.01) | |
| *C23C 16/04* | (2006.01) | |
| *C23C 16/52* | (2006.01) | |
| *C23C 16/54* | (2006.01) | |
| *H01L 21/67* | (2006.01) | |
| *B23Q 3/152* | (2006.01) | |
| *B23Q 3/18* | (2006.01) | |
| *H10K 71/00* | (2023.01) | |

(52) U.S. Cl.
CPC .......... *C23C 14/568* (2013.01); *C23C 16/042* (2013.01); *C23C 16/52* (2013.01); *C23C 16/54* (2013.01); *H01L 21/67173* (2013.01); *B23Q 3/152* (2013.01); *B23Q 3/186* (2013.01); *H10K 71/00* (2023.02)

(56) References Cited

U.S. PATENT DOCUMENTS

| | | | |
|---|---|---|---|
| 8,470,403 B2 | 6/2013 | Fukao | |
| 8,962,360 B2 | 2/2015 | Chang et al. | |
| 9,777,364 B2 | 10/2017 | Chang | |
| 2013/0009177 A1 | 1/2013 | Chang | |
| 2013/0341598 A1* | 12/2013 | Chang | H01L 21/6776 118/712 |
| 2014/0065293 A1* | 3/2014 | Kim | C23C 14/52 118/712 |
| 2014/0116337 A1* | 5/2014 | Kim | C23C 14/568 118/720 |
| 2014/0284559 A1* | 9/2014 | Kim | H10K 71/166 438/46 |
| 2015/0044803 A1* | 2/2015 | Son | C23C 14/24 438/46 |
| 2019/0006216 A1* | 1/2019 | Lau | H01L 21/67715 |
| 2020/0190660 A1* | 6/2020 | Ogawa | H01L 21/6776 |
| 2020/0194293 A1* | 6/2020 | Himeji | C23C 16/52 |
| 2021/0210652 A1 | 7/2021 | Lin | |

FOREIGN PATENT DOCUMENTS

| | | |
|---|---|---|
| CN | 107858650 A | 3/2018 |
| CN | 107919311 A | 4/2018 |
| JP | H01312072 A | 12/1989 |
| JP | 2008166348 A | 7/2008 |
| JP | 20130016491 A | 1/2013 |
| JP | 2014118611 A | 6/2014 |
| JP | 2015001024 A | 1/2015 |

OTHER PUBLICATIONS

Office Action issued in Chinese Appln. No. 201911280341.8 mailed Apr. 1, 2022. English translation provided.

"Fine Processing Technology of Very Large Scale Integrated Circuit." Semiconductor Research Foundation. Apr. 30, 1981: 130. Cited in NPL 1. English translation provided.

Office Action issued in Chinese Appln. No. 201911280341.8 mailed on Sep. 14, 2021. English translation provided.

\* cited by examiner

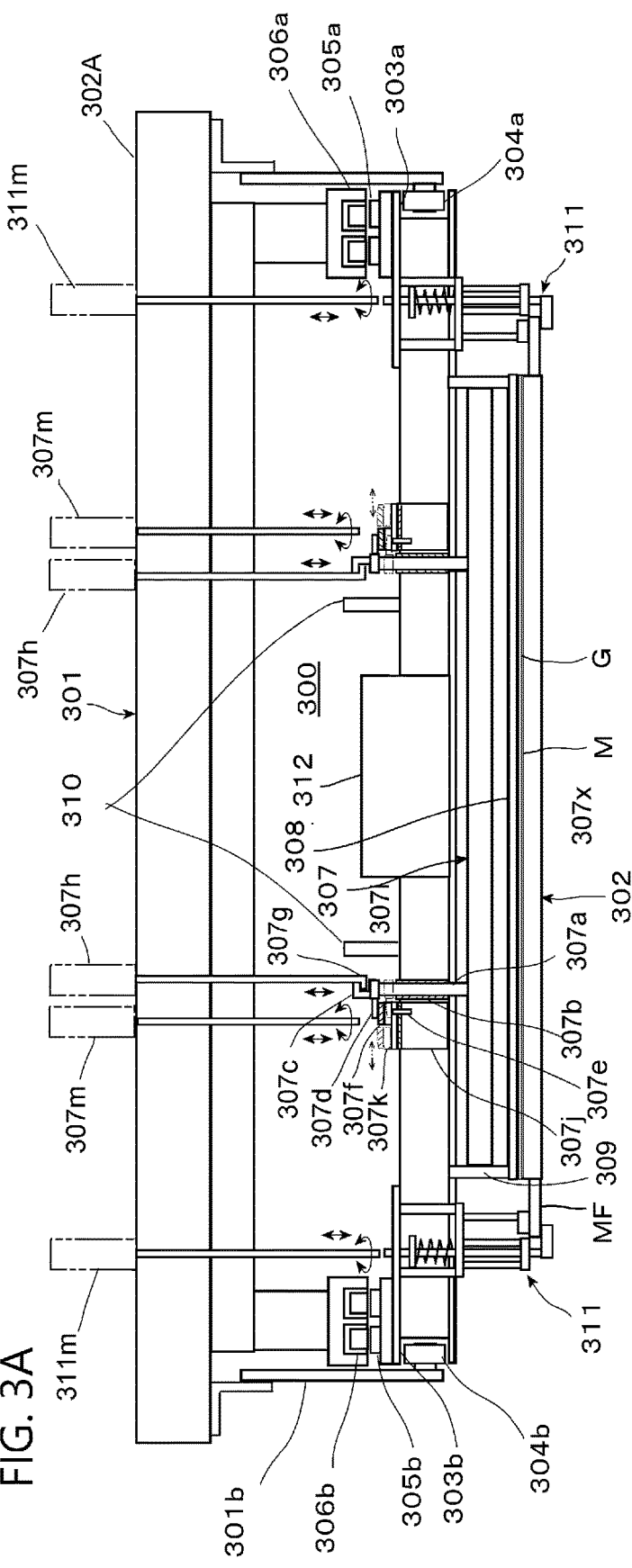
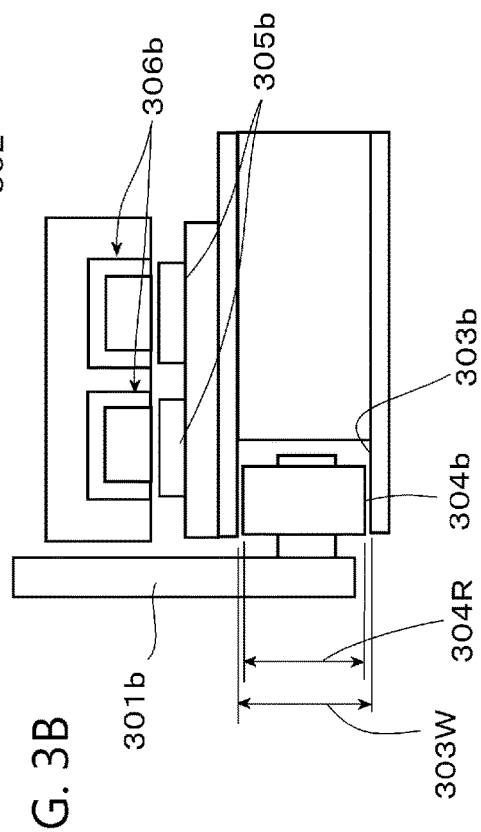
FIG. 3A
FIG. 3B
FIG. 3C

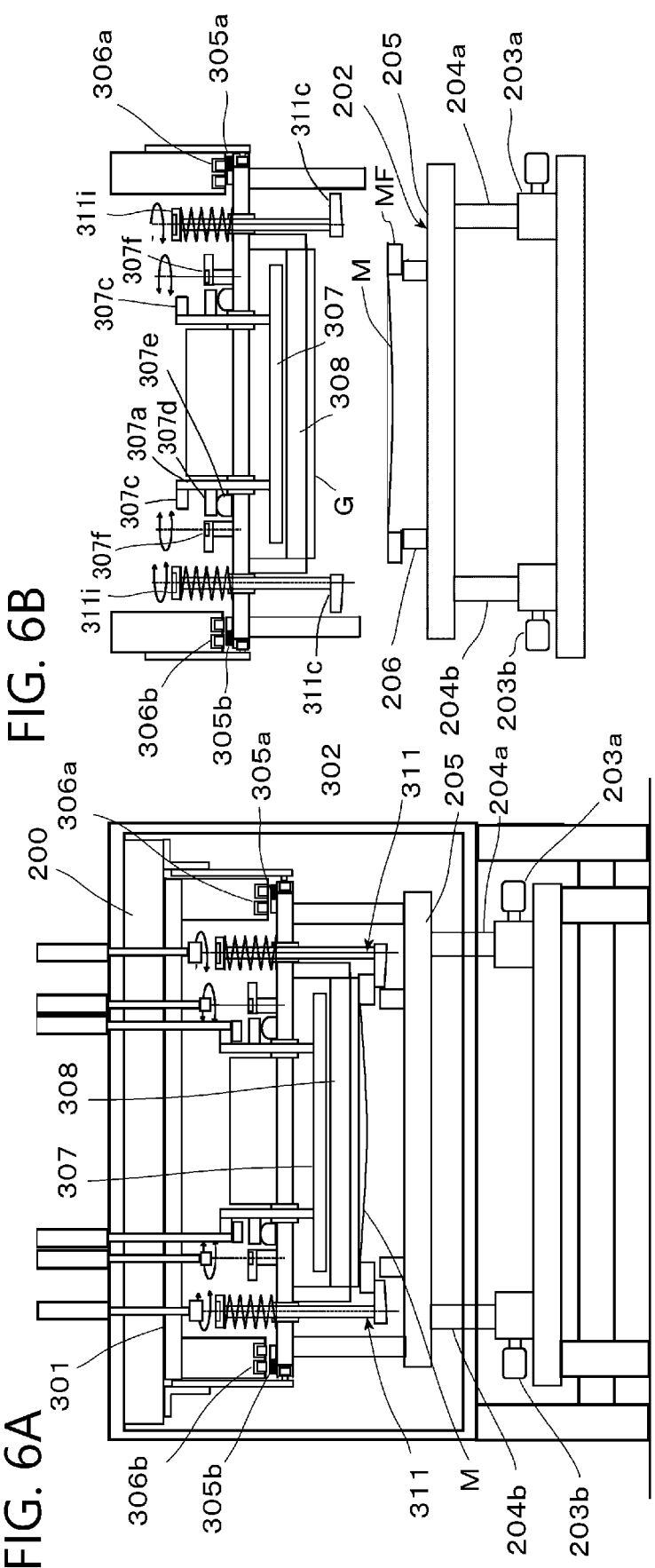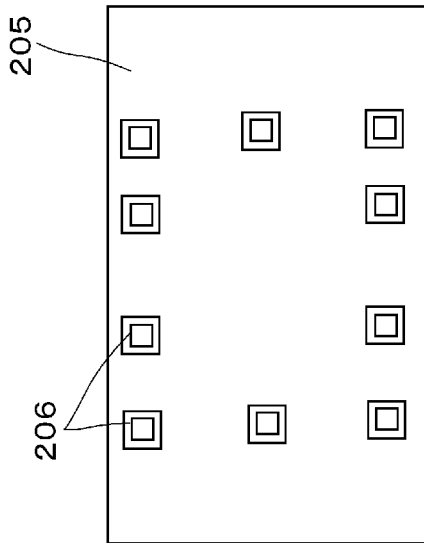
FIG. 6A
FIG. 6B
FIG. 6C

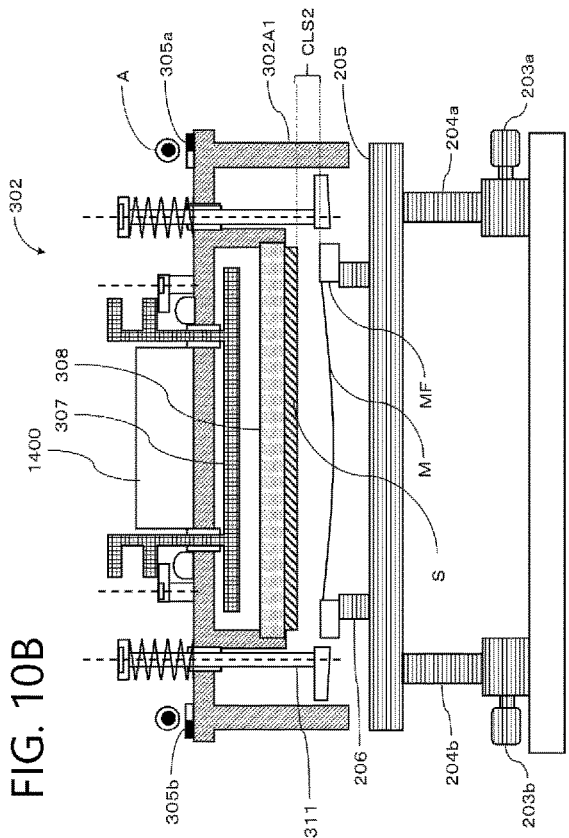
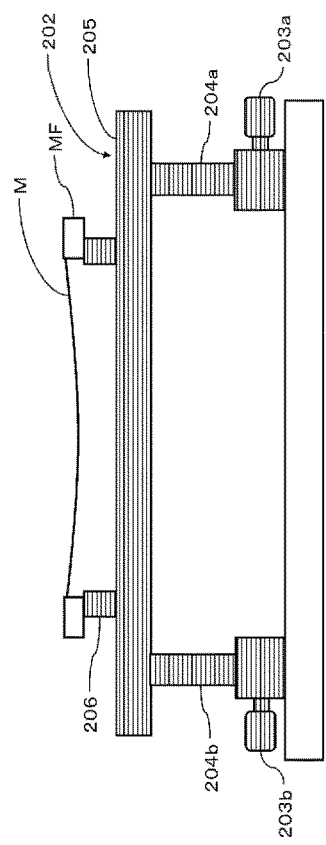
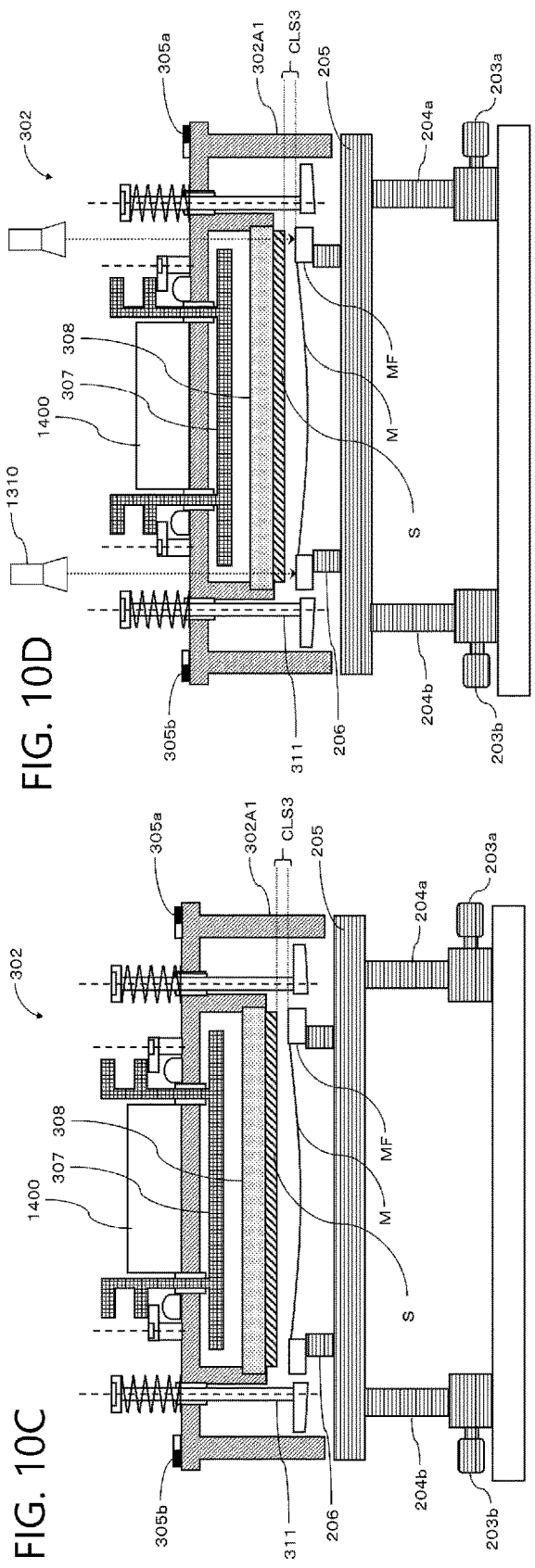
FIG. 10A
FIG. 10B
FIG. 10C
FIG. 10D

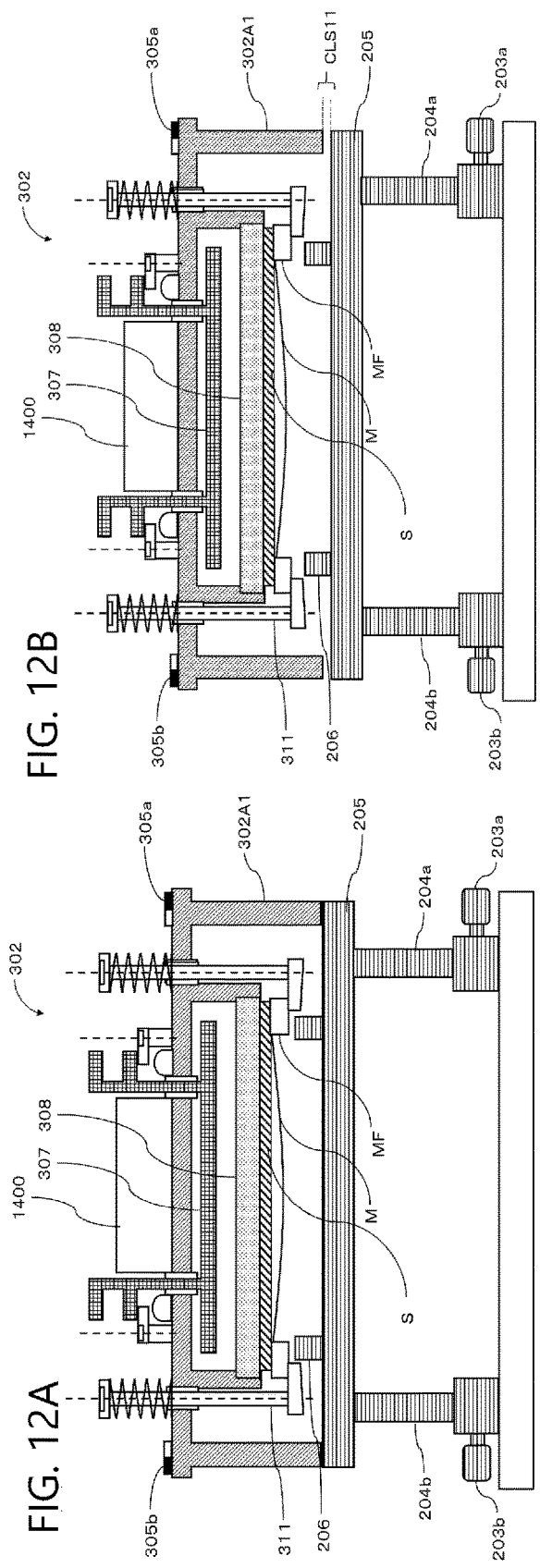
FIG. 12A
FIG. 12B
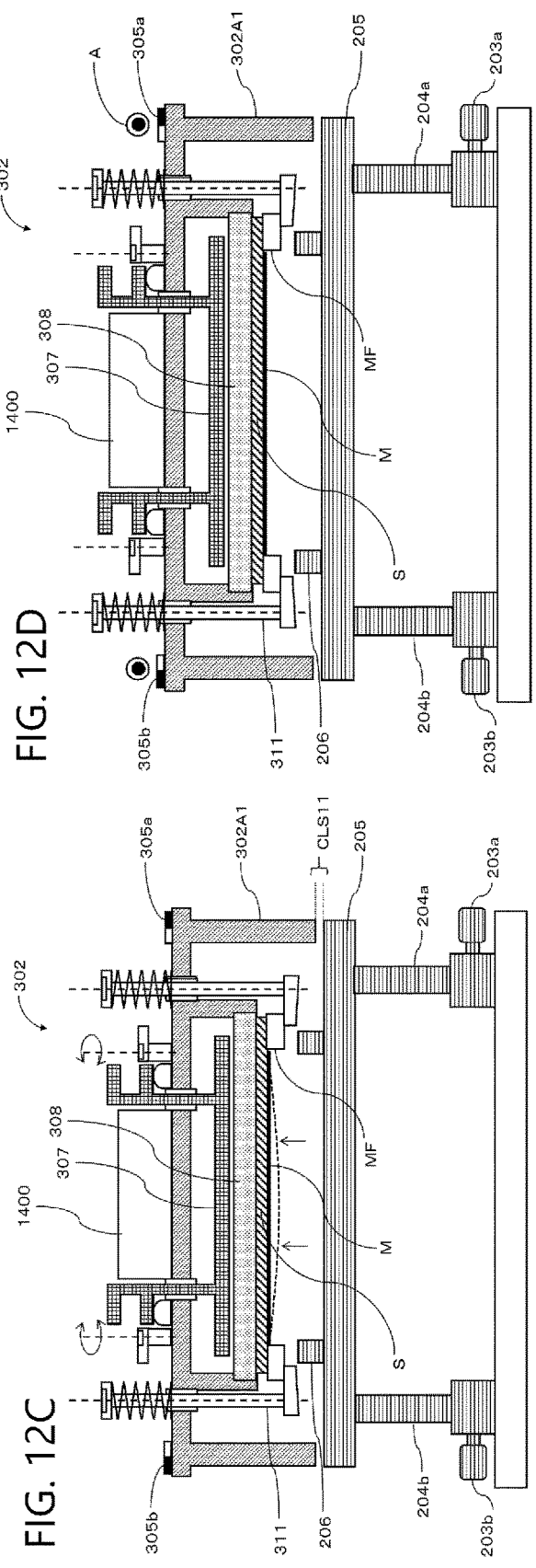
FIG. 12C
FIG. 12D

DEPOSITION APPARATUS, ELECTRONIC DEVICE MANUFACTURING APPARATUS, AND DEPOSITION METHOD

BACKGROUND OF THE INVENTION

Field of the Invention

The present invention relates to a deposition apparatus, an electronic device manufacturing apparatus, and a deposition method.

Description of the Related Art

Conventionally, deposition apparatuses for forming a film by depositing a deposition material on a film formation target such as a glass substrate are used and, for example, organic layer deposition apparatuses for depositing organic layers when an organic EL panel is manufactured are known. Such deposition apparatuses include a cluster type deposition apparatus and an in-line type deposition apparatus. In a cluster type deposition apparatus, a plurality of deposition chambers in which film formation is performed on a glass substrate are arranged in a cluster form and a glass substrate is sequentially transported to the respective deposition chambers such that a plurality of layers are deposited thereon. On the other hand, in an in-line type deposition apparatus, film formation is performed on a glass substrate for film formation in a deposition chamber while the glass substrate is linearly transported. In the in-line type, a plurality of deposition chambers may be provided in a linear direction.

Japanese Patent Application Publication No. 2013-016491 discloses an in-line type organic layer deposition apparatus. The apparatus of Japanese Patent Application Publication No. 2013-016491 includes a first circulation unit composed of a loading part into which a glass substrate is loaded, a deposition part in which a film is deposited on the glass substrate, and an unloading part from which the glass substrate is unloaded in a linear direction. In addition, the apparatus includes a second circulation unit which retrieves a transport carrier including an electrostatic chuck for transporting substrates.

In a deposition process, first, a glass substrate is loaded into a first rack of the loading part of the first circulation unit from the outside of the apparatus. The loaded glass substrate is mounted by a robot on the upper surface of the transport carrier disposed in the second circulation unit. The transport carrier chucks and holds the glass substrate. Subsequently, the substrate is flipped along with the transport carrier by a first flipping robot and transported to the deposition part. The glass substrate is disposed on the lower surface of the transport carrier according to such flipping. In the deposition part, deposition is performed on the substrate through a mask disposed in a fixed manner in the deposition part using a deposition source disposed under the substrate while the substrate is being transported.

After completion of deposition, the transport carrier holding the glass substrate transported to an unloading chamber is reversed again by a second flipping robot. After flipping, the transport carrier holding the glass substrate is unloaded to the second circulation unit by an unloading robot. The transport carrier moved to the second circulation unit releases the glass substrate. Subsequently, only the glass substrate is transported to an unloading chamber by the unloading robot and unloaded from the apparatus. The transport carrier which has released the glass substrate is transported to the second circulation unit, returned to a position corresponding to the loading part of the first circulation unit and used to hold a new glass substrate. Meanwhile, a lateral magnetic levitation bearing is used to transport a substrate in the deposition part.

Patent Literature 1: Japanese Patent Application Publication No. 2013-016491

SUMMARY OF THE INVENTION

However, in Patent Literature 1, a plurality of robots are used to transport substrates in addition to a lateral magnetic levitation bearing. Accordingly, there is a high probability that dust and particles generated during transport of a substrate will become attached to the surface of the substrate and it is difficult to perform substrate transport in a clean environment. In addition, since a substrate is turned by a robot in a planar direction, a substrate transport direction becomes complicated which causes dust and particles to become attached to the substrate.

An object of the present invention devised in view of the aforementioned circumstances is to provide a technology for transporting substrates in a clean environment in an in-line type deposition apparatus.

The present invention provides a deposition apparatus comprising:

a transport mechanism including a transport carrier which holds and transports a substrate, and transport modules which constitute a transport path through which the transport carrier moves;

an alignment chamber in which the substrate held by the transport carrier is loaded and a mask is positioned and fixed to the loaded substrate;

a deposition chamber in which the substrate held by the transport carrier is loaded from the alignment chamber and deposition materials are deposited on the loaded substrate; and control means which controls a magnetic force generated between a plurality of magnets arranged in the transport carrier in a transport direction of the substrate and a plurality of coils arranged to face the plurality of magnets in each transport module by applying a current or a voltage to the plurality of coils, wherein the control means is able to switch a transport mode of the transport mechanism between a first mode in which the magnetic force is generated and transport is performed in a state in which the transport carrier is not in contact with the transport module, and a second mode in which transport is performed in a state in which the transport carrier is in contact with the transport module.

The present invention also provides a deposition method for performing deposition on a substrate while transporting the substrate by a transport mechanism including a transport carrier which holds and transports the substrate, and transport modules which constitute a transport path through which the transport carrier moves, wherein the transport carrier includes a plurality of magnets arranged in a transport direction of the substrate, each of the transport modules includes a plurality of coils arranged to face the plurality of magnets, and a magnetic force generated between the plurality of magnets and the plurality of coils is controlled by applying a current or a voltage to the plurality of coils, the deposition method comprising:

an alignment process of positioning and fixing a mask to the substrate held by the transport carrier; and a deposition process of depositing deposition materials on the aligned substrate; wherein a transport mode of the transport mechanism is switchable between a first mode in which the magnetic force is generated and transport is performed in a state in which the transport carrier is not in contact with the transport module, and a second mode in which transport is performed in a state in which the transport carrier is in contact with the transport module.

According to the present invention, it is possible to provide a technology for transporting substrates in a clean environment in an in-line type deposition apparatus.

Further features of the present invention will become apparent from the following description of exemplary embodiments with reference to the attached drawings.

BRIEF DESCRIPTION OF THE DRAWINGS

FIGS. 3A to 3C are schematic diagrams showing a transport unit, FIG. 3A is a general view, FIG. 3B is an enlarged view of a principal part, and FIG. 3C is a side view of a transport carrier;

FIGS. 6A to 6C are schematic diagrams showing an alignment chamber, FIG. 6A is a general view, FIG. 6B is an enlarged view of a principal part and FIG. 6C is a plan view;

FIGS. 10A to 10D are schematic diagrams showing respective steps of the progress of alignment;

FIGS. 12A to 12D are schematic diagrams showing procedures of respective steps of the progress of alignment;

FIGS. 13A and 13B are conceptual diagrams of alignment marks on a substrate and a mask, and FIG. 13C is a conceptual diagram of an alignment system.

DESCRIPTION OF THE EMBODIMENTS

Hereinafter, preferred embodiments of the present invention will be described with reference to the drawings. However, dimensions, materials, shapes and a relative disposition of components described below or a hardware configuration and a software configuration, a processing flow, manufacturing conditions of an apparatus, and the like can be appropriately changed according to a configuration and various conditions of an apparatus to which the invention is applied and do not limit the scope of the invention to the description below. Meanwhile, the same components are denoted by the same reference signs in principle and description thereof is omitted.

The present invention is suitable for a deposition apparatus which performs film formation on a film formation target through deposition and typically can be applied to a deposition apparatus which deposits organic materials and the like on a glass substrate to form films in order to manufacture an organic EL panel. It is desirable that a material of a substrate that is a film formation target be a material suitable for an electrostatic chuck, and materials such as polymer films and metals can be selected in addition to glass. A substrate may be a glass substrate on which a film such as polyimide has been laminated, for example. Metallic materials (metals, metal oxides and the like) and the like may be selected as deposition materials in addition to organic materials. In addition, the present invention may be regarded as a control method and a deposition method for a deposition apparatus, a film formation apparatus for forming thin films and a control method thereof, and a film formation method. Furthermore, the present invention may also be regarded as an apparatus for manufacturing an electronic device using an organic EL panel and an electronic device manufacturing method. Moreover, the present invention may also be regarded as a program causing a computer to execute a control method and a storage medium storing the program. The storage medium may be a computer-readable non-transitory storage medium.

Overall Configuration of Manufacturing Line

Figure 1:
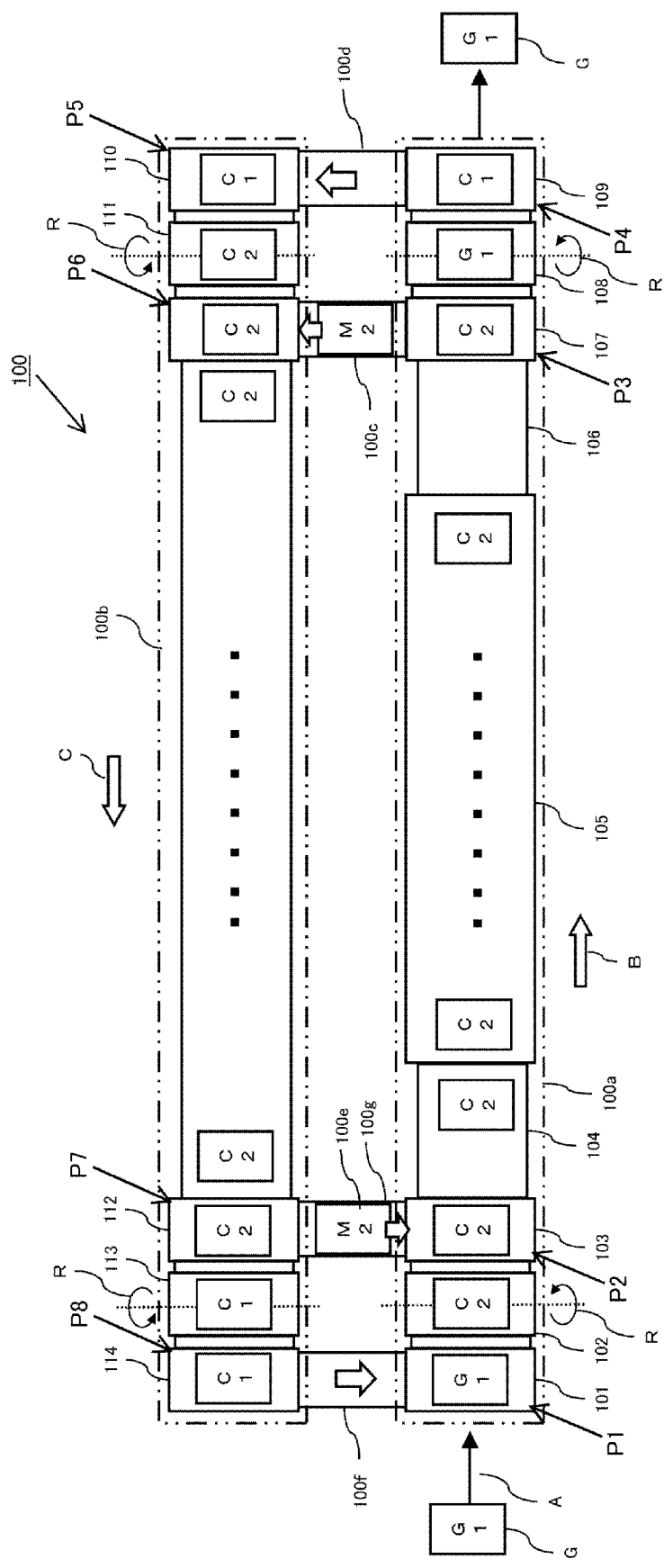
FIG. 1 is a schematic diagram showing an organic EL panel manufacturing line.

FIG. 1 is a schematic diagram showing an overall configuration of an organic EL panel manufacturing line 100. Generally, the manufacturing line 100 is composed of a circulation type transport path including a deposition process transport path 100*a*, a return transport path 100*b*, a mask transfer mechanism 100*c*, a carrier shifter 100*d*, a mask transfer mechanism 100*e*, and a carrier shifter 100*f*. Transport modules 301 for constituting the transport path may be disposed in components constituting the circulation type transport path, for example, a substrate loading chamber 101, a flip chamber 102, an alignment chamber 103, an acceleration chamber 104, a deposition chamber 105, a deceleration chamber 106, a mask separation chamber 107, a flip chamber 108, a glass substrate unloading chamber 109, and the like. This figure shows how a glass substrate G, a mask M, an electrostatic chuck 308 (reference sign C) and the like are transported on the transport path in each stage of a manufacturing process, which will be described in detail later.

Through the deposition process transport path 100*a*, generally, a glass substrate G is loaded in a transport direction (arrow A) from the outside, the glass substrate G and a mask M are positioned and held on a transport carrier, deposition processing is performed on the glass substrate G and the mask M while the glass substrate G and the mask M are moved along with the transport carrier 302 on the transport path, and then the glass substrate G on which film formation has been performed is unloaded. The mask M separated off after completion of deposition processing and the transport carrier 302 after glass substrate unloading are returned to the substrate loading chamber using the return transport path 100*b*.

In the mask transfer mechanism 100*c*, the mask M separated from the transport carrier after completion of deposition processing is moved to the return transport path. The mask M moved to the return transport path is mounted again on the transport carrier 302 vacant due to unloading of the substrate. In the carrier shifter 100*d*, the vacant transport carrier 302 from which the glass substrate G has been unloaded to the next process is transferred to the return transport path 100*b*. In the mask transfer mechanism 100*e*, the mask M separated from the transport carrier transported through the return transport path 100*b* is transported to a mask mounting position P2 on the deposition process transport path 100a. In the carrier shifter 100f, the vacant transport carrier after separation of the mask M is transported from the return transport path 100b to a glass substrate loading position P1 at the start point of the deposition process transport path 100a. The manufacturing process using the manufacturing line 100 will be described in detail later.

Figure 2:
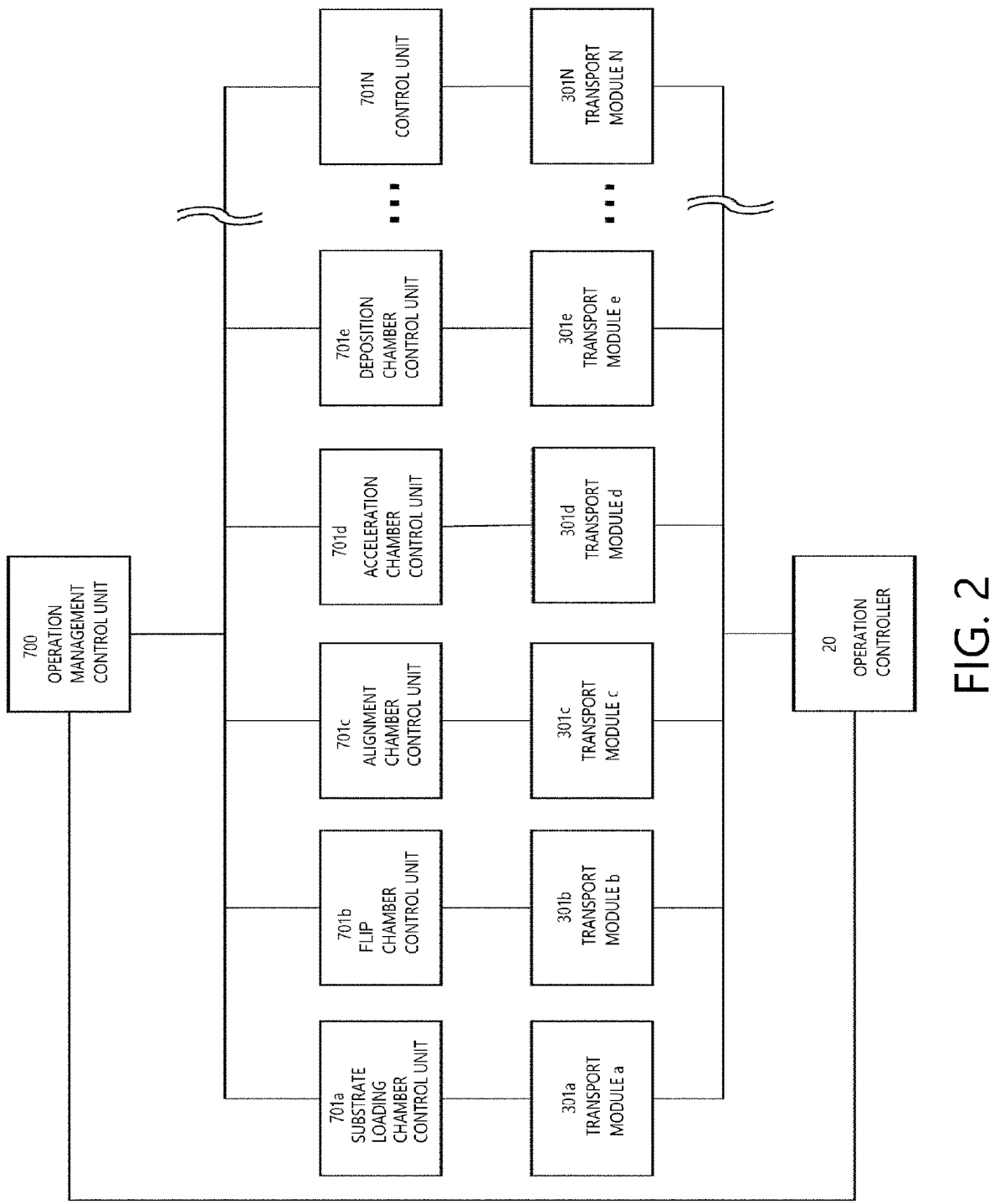
FIG. 2 is a control block diagram of the organic EL panel manufacturing line.

FIG. 2 is a conceptual diagram of a control block of the manufacturing line 100. The control block includes an operation management control unit 700 which manages overall operation information of the manufacturing line 100 and an operation controller 20. In addition, driving control units which control driving mechanisms in respective chambers (respective devices) constituting the manufacturing line 100, such as the substrate loading chamber 101, the flip chamber 102, the alignment chamber 103, the acceleration chamber 104 and the deposition chamber 105, are provided in the respective chambers. That is, a substrate loading chamber control unit 701a is provided in the substrate loading chamber 101, a flip chamber control unit 701b is provided in the flip chamber 102, an alignment chamber control unit 701c is provided in the alignment chamber 103, an acceleration chamber control unit 701d is provided in the acceleration chamber 104, and a deposition chamber control unit 701e is provided in the deposition chamber 105. A control unit 701N is provided in each device (each chamber) in addition to the aforementioned devices. The operation management control unit 700 which manages these driving control units and the entire apparatus may be considered to be included in a control means. In addition, the operation controller 20 may also be considered to be included in the control means.

Furthermore, a transport module a (301a) is provided in the substrate loading chamber 101, a transport module b (301b) is provided in the flip chamber 102, a transport module c (301c) is provided in the alignment chamber 103, a transport module d (301d) is provided in the acceleration chamber 104, and a transport module e (301e) is provided in the deposition chamber 105. A transport module 301N is provided in each chamber in addition to the aforementioned chambers. A plurality of driving coils are linearly disposed in a transport direction of the glass substrate G and the transport carrier 302 in each transport module 301 provided in each device, which will be described in detail later. Driving of the transport carrier 302 is controlled by controlling a current flowing through each driving coil or a voltage applied thereto in response to a value of an encoder provided in each transport module 301. Since magnets linearly arranged in the transport carrier 302 and coils arranged to face the magnets of the transport carrier 302 in the transport module 301 transport a substrate in cooperation, the transport carrier 302 and the transport module 301 may be combined and regarded as a transport unit 300 (transport mechanism).

An encoder which detects the position of the transport carrier 302 is provided in each transport module 301. The operation management control unit 700 transmits an instruction to the driving control unit of each chamber in response to a detection value of the encoder and starts or stops control of the driving mechanism of each chamber or changes a control state. Meanwhile, to trigger control, any sensor used for control can be used as well as encoder detection values.

Configuration of Transport Module

The transport module 301 includes a main frame having an opening through which the transport carrier 302 passes, and includes driving coils 306 and coil drivers which are linearly arranged in the transport direction of the transport carrier 302 such that the coils and the coil drivers are paired and disposed on left and right sides with respect to the transport direction. Each transport path through which the transport carrier 302 moves is constructed by arranging the plurality of transport modules 301 in series such that the openings face each other. In addition, the transport module 301 includes a guide mechanism which guides the transport carrier 302 in the transport direction and a driving system which performs driving and posture control of the transport carrier 302 using a magnetic force. Accordingly, the transport carrier 302 can continuously travel on the transport path constructed using the plurality of transport modules 301 without deviating from a track. Furthermore, a plurality of transport carriers 302 can simultaneously travel on the transport path.

The transport unit 300 performs transport according to linear motor control and typically uses a moving magnet type linear motor. As shown in FIG. 2, the transport unit 300 includes N transport modules 301a to 301N and an operation controller 20. The transport modules 301a to 301N are sequentially arranged side by side to form one transport path. The transport carrier moves on the transport path composed of the transport modules 301a to 301N.

The operation controller 20 transmits a driving profile as a driving command indicating association of a time and a target position to all transport carriers 302 present in a linear motor control system. The operation controller 20 transmits a start signal as a group of transport commands to the transport modules 301a to 301N such that the transport carriers 302 on the manufacturing line simultaneously move. In addition, when operations of the transport modules 301a to 301N are abnormal, the operation controller 20 receives error signals from the transport modules 301a to 301N and performs control such as stopping all the transport modules 301a to 301N.

Linear Motor Control

Figure 7:
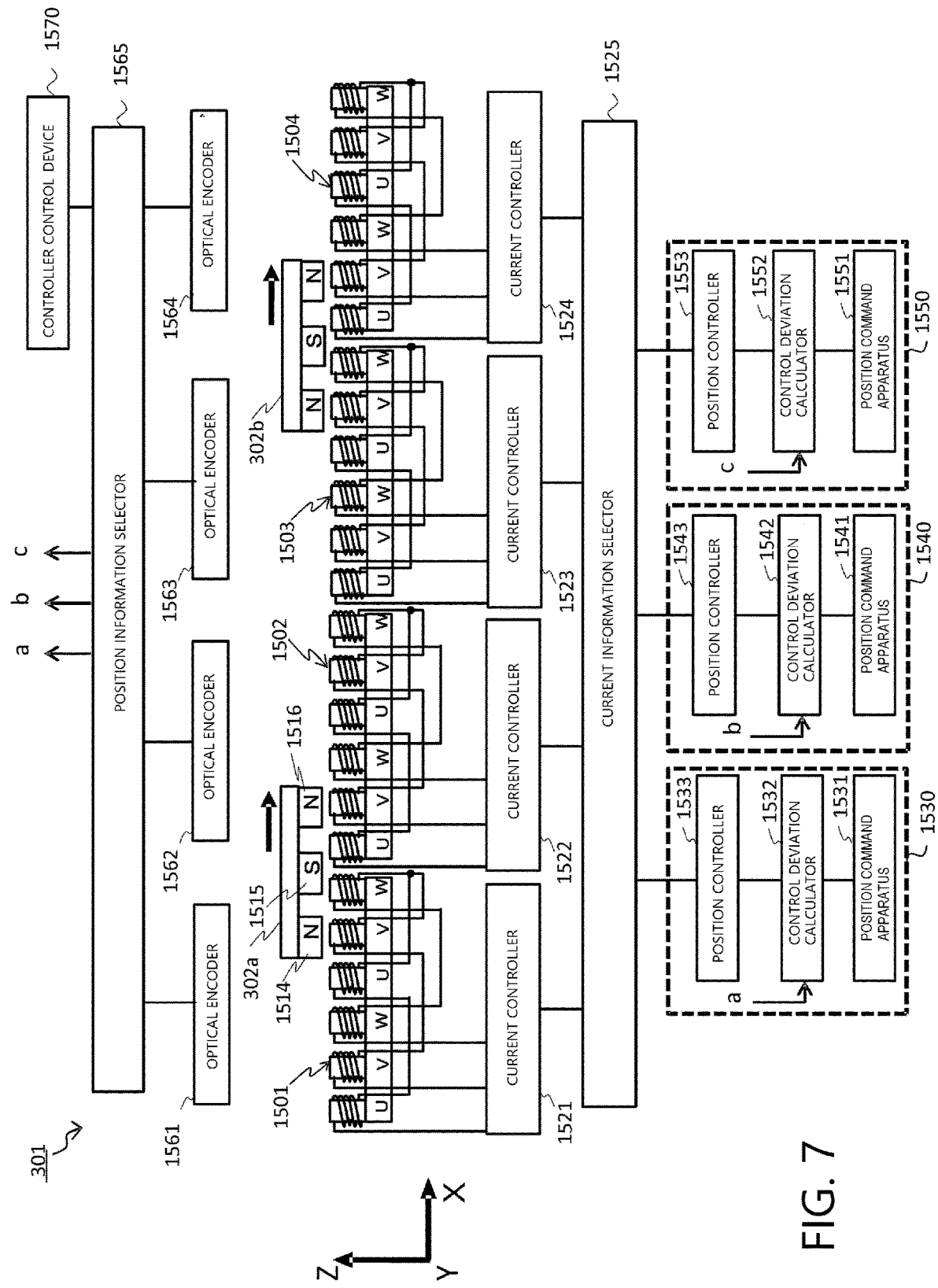
FIG. 7 is a diagram showing a state of transport using magnets.

Here, linear motor propulsion control will be described with reference to FIG. 7. FIG. 7 is a schematic configuration diagram showing one of the plurality of transport modules 301 included in the manufacturing line and parts related to linear motor control among control means thereof. Further, FIG. 7 is a diagram for describing the principle of moving magnet type linear motor propulsion control, and a relation of arrangement and numbers of respective members (e.g., positional relationship between coils and magnets, a carrier transport direction, and configuration of a control block), and the like in the description below are merely examples. In FIG. 7, an X axis is defined as a progress direction in which the transport carrier 302 moves, a Y axis is defined as a direction intersecting the X axis in the horizontal plane, and a Z axis is defined as a vertical direction when viewed from a coil unit 1501.

The transport module 301 includes a plurality of coil units 1501 to 1504. A transport path of the transport carrier 302 is formed by sequentially disposing the plurality of coil units 1501 to 1504. For example, a track of the transport carrier 302 is defined by inserting a roller bearing attached to the transport module 301 into a guide groove included in the transport carrier 302. Each transport carrier 302 includes magnets 1514 to 1516 serving as movers.

The coil units 1501 to 1504 have a plurality of coils such that three-phase driving composed of a plurality of phases, that is, U phase, V phase and W phase can be performed. In the example of FIG. 7, each of the coil units 1501 to 1504 is composed of six coils in which two U-phase coils, two V-phase coil and two W-phase coils are serially connected.

Although the coil unit 1501 is constructed by combining a plurality of coils and a core formed from an electromagnetic steel plate, a configuration in which a core is not used may be used. Although the length of the single coil unit 1501 may be 100 mm, for example, the length of the coil unit 1501 is not limited thereto. Further, the number of serial connections of the coil unit 1501 is not limited, and the coil unit 1501 may be composed of three coils which form three phases including a U phase, V phase and W phase.

The current controller 1521 to 1524 are electrically connected to the respective coil units 1501 to 1504 corresponding thereto through electrical lines such as electric power wires, supply a current Iu with a U phase to a U-phase coil, supply a current Iv with a V phase to a V-phase coil and supply a current Iw with a W phase to a W-phase coil. As a result, each coil is excited through electrification and thus the coil units 1501 to 1504 can control the transport carrier 302.

The current controllers 1521 to 1524 are connected to a current information selector 1525, and a current controller selected by the current information selector 1525 supplies a driving current to the coil unit corresponding thereto. The current information selector 1525 is connected to motor controllers 1530, 1540 and 1550. The current information selector 1525 selects and switches any one or a plurality of the current controllers 1521 to 1524 as an input destination of current control information output from the motor controllers 1530, 1540 and 1550 on the basis of current control information exchange signals transmitted from the motor controllers 1530, 1540 and 1550. A current control information exchange signal is a signal used for the current information selector 1525 to select one or a plurality of current controllers which supply current to a coil unit for controlling the transport carrier 302 that is a control target. Although the motor controller 1530 will be described below, the motor controllers 1530, 1540 and 1550 have the same configuration.

The motor controller 1530 includes a position command apparatus 1531, a control deviation calculator 1532 and a position controller 1533 which perform operation control of the transport carrier 302. The position command apparatus 1531 outputs position order information that is a target position of the transport carrier 302 that is a control target to the control deviation calculator 1532. The position command apparatus 1531 outputs the position order information of the transport carrier 302 to the control deviation calculator 1532 on the basis of a driving profile transmitted from the operation controller 20. The control deviation calculator 1532 calculates a difference between the position order information output from the position command apparatus 1531 and a position of the transport carrier 302 output from any of a plurality of optical encoders 1561 to 1564 and outputs the obtained difference as control deviation information.

The position controller 1533 performs proportional integral derivative controller (PID) control using the control deviation information calculated by the control deviation calculator 1532 and outputs current control information as a current control signal. Meanwhile, the current control information exchange signal output from the motor controller 1530 may be generated by the position controller 1533. Similarly, the motor controller 1540 includes a position command apparatus 1541, a control deviation calculator 1542 and a position controller 1543, the motor controller 1550 includes a position command apparatus 1551, a control deviation calculator 1552 and a position controller 1553, and the functions of the components are the same as those of the motor controller 1530. In FIG. 7, although the number of motor controllers is 3, as many motor controllers as the number of transport carriers 302 that are control targets may be provided. Furthermore, driving profiles transmitted from the operation controller 20 to the motor controllers 1530, 1540 and 1550 may be stored in memories (not shown) accessible by the position command apparatuses 1531, 1541 and 1551.

The optical encoders 1561 to 1564 are arranged to correspond to control areas of the coil units 1501 to 1504. The optical encoders 1561 to 1564 detect and identify a position of a scale disposed in the transport carrier 302. Meanwhile, it is desirable that positions at which the plurality of optical encoders 1561 to 1564 are disposed and the length of the scale 205 be determined such that the position of the transport carrier 302 can be detected wherever the transport carrier 302 is located on the transport path. In addition, it is desirable that the optical encoders 1561 to 1564 have a resolution of several µm per 1 count. Meanwhile, the arrangement and number of optical encoders 1561 to 1564 are not limited to the shown example. Further, a magnetic encoder or the like may also be used as a position detection mechanism. Furthermore, an absolute type or an increment type may be used for the optical encoders 1561 to 1564.

The position information selector 1565 is connected to the optical encoders 1561 to 1564. Signs a, b and c given to arrows extending from the position information selector 1565 respectively correspond to signs a, b and c of the motor controllers 1530, 1540 and 1550. That is, the position information selector 1565 is connected to the control deviation calculators 1532, 1542 and 1552 included in the motor controllers 1530, 1540 and 1550. A controller control device 1570 is connected to the position information selector 1565 and the motor controllers 1530, 1540 and 1550 (not shown). The controller control device 1570 allocates the transport carrier 302 detected by the optical encoders 1561 to 1564 to any of the motor controllers 1530, 1540 and 1550 and transmits a position information selection signal that is information about allocation to the position information selector 1565. The position information selector 1565 combines any of the motor controllers 1530, 1540 and 1550 with any of the optical encoders 1561 to 1564 such that they can communicate with each other according to the position information selection signal transmitted from the controller control device 1570. The controller control device 1570 receives, from each of the motor controllers 1530, 1540 and 1550, control state information indicating whether each motor controller is controlling the transport carrier 302 or in an idle state in which it does not control the transport carrier 302. The controller control device 1570 stores the control state information in a memory which is not shown, or the like such that the position of the transport carrier 302 detected by the optical encoders can be transmitted to a motor controller in an idle state.

According to such a configuration, the control system can control transport carriers by detecting the position of each transport carrier 302 and controlling a current or a voltage to be applied to a coil unit corresponding thereto.

Configuration of Transport Carrier

Figure 4:
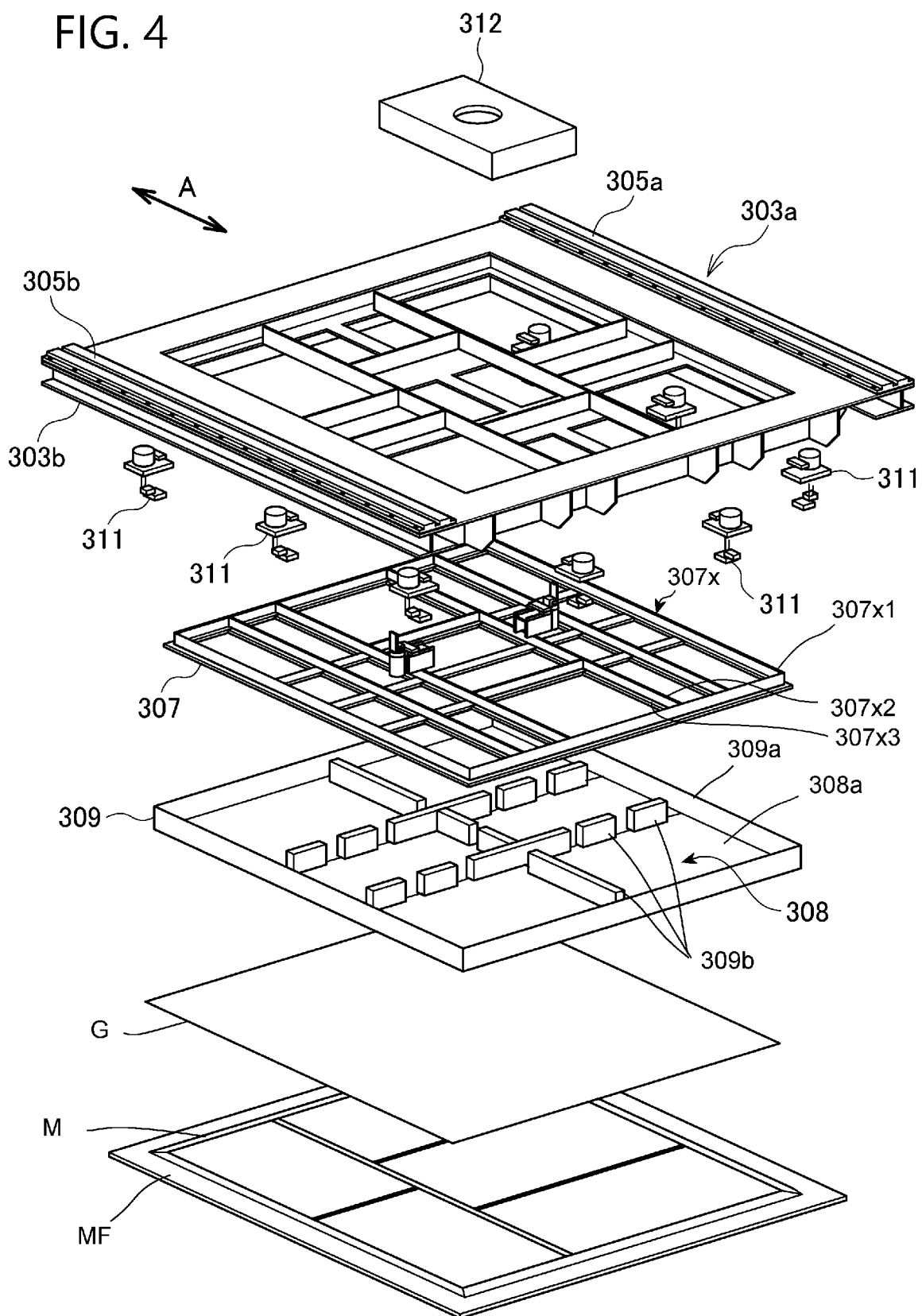
FIG. 4 is an exploded perspective view of the transport carrier.

FIG. 3A is a front view of the transport unit 300 composed of the transport module 301 as a fixed part and the transport carrier 302 as a movable part, viewed in the transport direction denoted by arrow A in FIG. 1. FIG. 3B is an enlarged view of a principal part surrounded by an outline S in FIG. 3A, FIG. 3C is a side view of the transport carrier 302, and FIG. 4 is an exploded perspective view of the transport carrier. A plurality of transport modules 301 are arranged over the entire area of the manufacturing line 100 to constitute a transport path. It is possible to control all of the plurality of transport modules as a single transport path by controlling a current supplied to driving coils of the respective transport modules 301 to continuously move the transport carrier 302.

In the figures, the carrier body 302A of the transport carrier 302 is composed of a rectangular frame, and guide grooves 303*a* and 303*b* having a cross section in a recess shape and parallel to the transport direction A are respectively formed on the left and right side of the carrier body 302A. Further, roller bearings (guide rollers) 304*a* and 304*b* composed of a plurality of roller arrays are rotatably attached to the inner sides of side plates 3011*a* and 3011*b* of the transport module 301. In addition, the roller bearings 304*a* and 304*b* are respectively inserted into the guide grooves 303*a* and 303*b* such that the transport carrier 302 is movably supported in the direction of arrow A (transport direction) with respect to the transport module 301.

Driving magnets 305*a* and 305*b* (magnet arrays) including a plurality of magnets arranged in a predetermined pattern are linearly disposed in parallel to a substrate transport direction (progress direction) on both sides of the carrier body 302A of the transport carrier 302 above the positions where the guide grooves 303*a* and 303*b* are formed. Further, driving coils 306*a* and 306*b* (coil arrays) including a plurality of coils arranged in a predetermined pattern are disposed on the transport module 301 side. The driving magnets 305*a* and 305*b* and the driving coils 306*a* and 306*b* are disposed such that they approach each other while facing each other when the transport carrier 302 is supported by the transport module 301. The transport carrier 302 can be levitated or travel in the direction of arrow A (transport direction) by an electromagnetic force acting between the driving magnets 305*a* and 305*b* on the transport carrier 302 side and the driving coils 306*a* and 306*b* on the transport module 301 side.

Meanwhile, the guide grooves 303*a* and 303*b* on the transport carrier side include a pair of upper and lower guide surfaces which are parallel to each other and surround rolling surfaces of the roller bearings 304*a* and 304*b*, and an opening width 303W between the guide surfaces is wider than the diameter 304R of the roller bearings 304*a* and 304*b* on the transport module side by a clearance CL (303W=304R+CL). According to this configuration, the roller bearings 304*a* and 304*b* can be levitated in the guide grooves within the range of the predetermined clearance CL.

According to this configuration, it is possible to control the above-described moving magnet type linear motor. That is, it is possible to generate a propulsion in the progress direction of the transport carrier 302 or generate a magnetic levitation force for the transport module 301 by controlling a current supplied to the plurality of coils constituting the driving coils 306*a* and 306*b* which constitute the driving system. It is desirable that coils be disposed on one of the transport module and the transport carrier included in the transport mechanism and magnets be disposed on the other, and levitation alignment of the transport carrier can be performed even in the case of a moving coil type.

Furthermore, according to the configurations of the transport module 301 and the transport carrier 302 shown in FIGS. 3A to 3C, it is also possible to transport the transport carrier 302 while supporting it with rollers using the roller bearings 304*a* and 304*b*. That is, it is possible to move the transport carrier 302 in a state in which the transport carrier 302 is not magnetically levitated (a state in which the transport carrier 302 sinks due to the weight thereof and thus guide grooves 303*a* and 303*b* are supported by the roller bearings 304*a* and 304*b* in contact therewith).

Selection of Transport Mode

When the transport carrier 302 is moved, any of a magnetic levitation transport mode (first mode) and a roller transport mode (second mode) can be selected. The roller transport mode is a mode in which a driving force in a progress direction is generated using an electromagnetic force generated between magnets and coils to transport the transport carrier 302 in a state in which the transport carrier 302 is supported according contact between the guide grooves of the transport carrier 302 and the roller bearings 304*a* and 304*b* on the transport module 301 side. The magnetic levitation transport mode is a mode in which a driving force in a progress direction is generated using an electromagnetic force to transport the transport carrier 302 in a state in which the transport carrier is magnetically levitated and the guide grooves 303*a* and 303*b* are not in contact with the roller bearings 304*a* and 304*b*. In the magnetic levitation transport mode, generation of dust, particles caused by friction, and the like is curbed because there is no mechanical contact part. Accordingly, it is suitable to prevent deposition quality deterioration, particularly, when vacuum deposition processing is performed. On the other hand, the roller transport mode can be used in places other than a deposition chamber where dust and particles caused by friction do not become a problem.

In FIGS. 3A to 3C, a supporting structure in which the roller bearings 304*a* and 304*b* are inserted into the guide grooves 303*a* and 303*b* is used. Accordingly, problems in which the transport carrier 302 drops on the transport path to damage equipment or deviates from the transport path when power failure or malfunction occurs during magnetic levitation transport may also be prevented.

In addition, it is possible to control the position and posture of the transport carrier 302 in various manners in the magnetic levitation transport mode by controlling an arrangement pattern of the plurality of magnets constituting the driving magnets 305*a* and 305*b*, an arrangement pattern of the plurality of coils constituting the driving coils 306*a* and 306*b*, and a current or a voltage supplied to each coil. For example, the position and posture may include a position in the progress direction (X axis) of the transport carrier 302, a position in an orthogonal direction (Y axis) within the same plane as the progress direction (a plane parallel to the plane of the glass substrate G) (i.e., positions on the left and right of the progress direction), a position in a height direction (Z axis) with respect to the transport module 301, a rotational position around the X axis, a rotational position around the Y axis, a rotational position around the Z axis, and the like. The position and posture of the transport carrier 302 can be controlled such that the position of the transport carrier is corrected on the basis of position information detected by a position sensor 310 (a linear encoder, a distance sensor, a scale or the like) provided between the transport module and the transport carrier. As a magnet arrangement pattern, for example, a type shown in FIGS. 8A and 8B may be provided. Although it will be described in detail later, position and posture control using magnets and coils can also be used for an operation of aligning the mask M with respect to the glass substrate G held by the transport carrier 302.

Figure 8A:
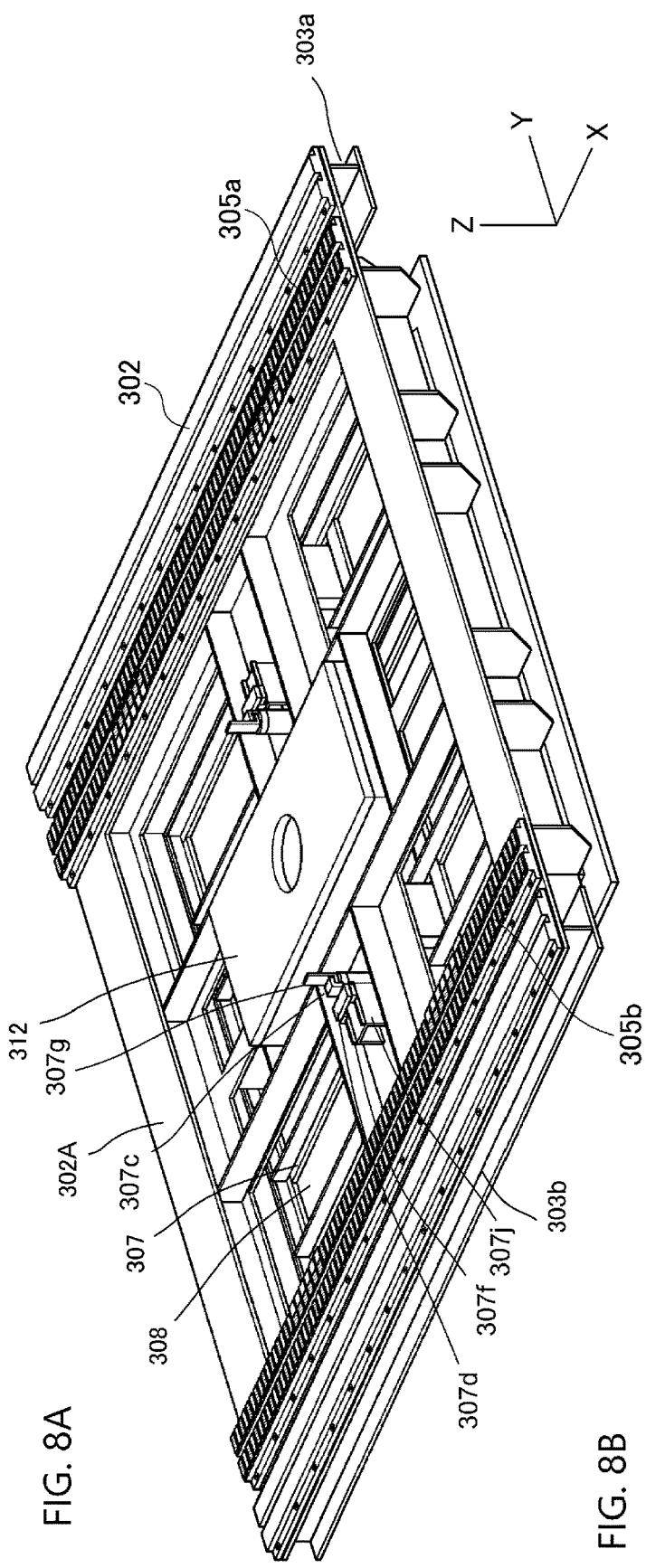
FIG. 8A is a perspective view of the transport carrier and FIG. 8B is a diagram showing a magnet arrangement configuration.
Figure 8B:
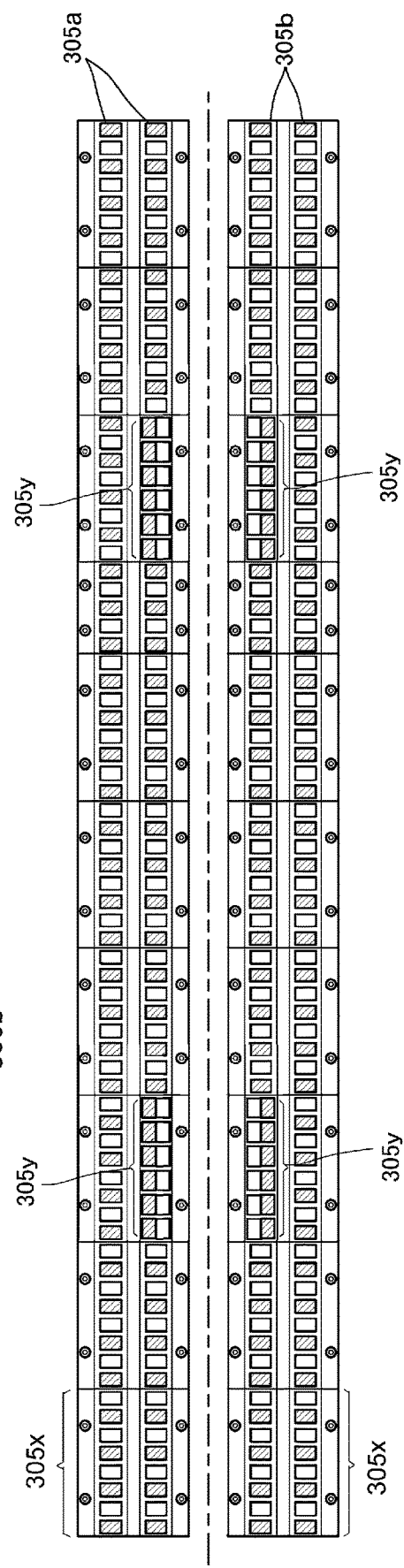
Figure 9:
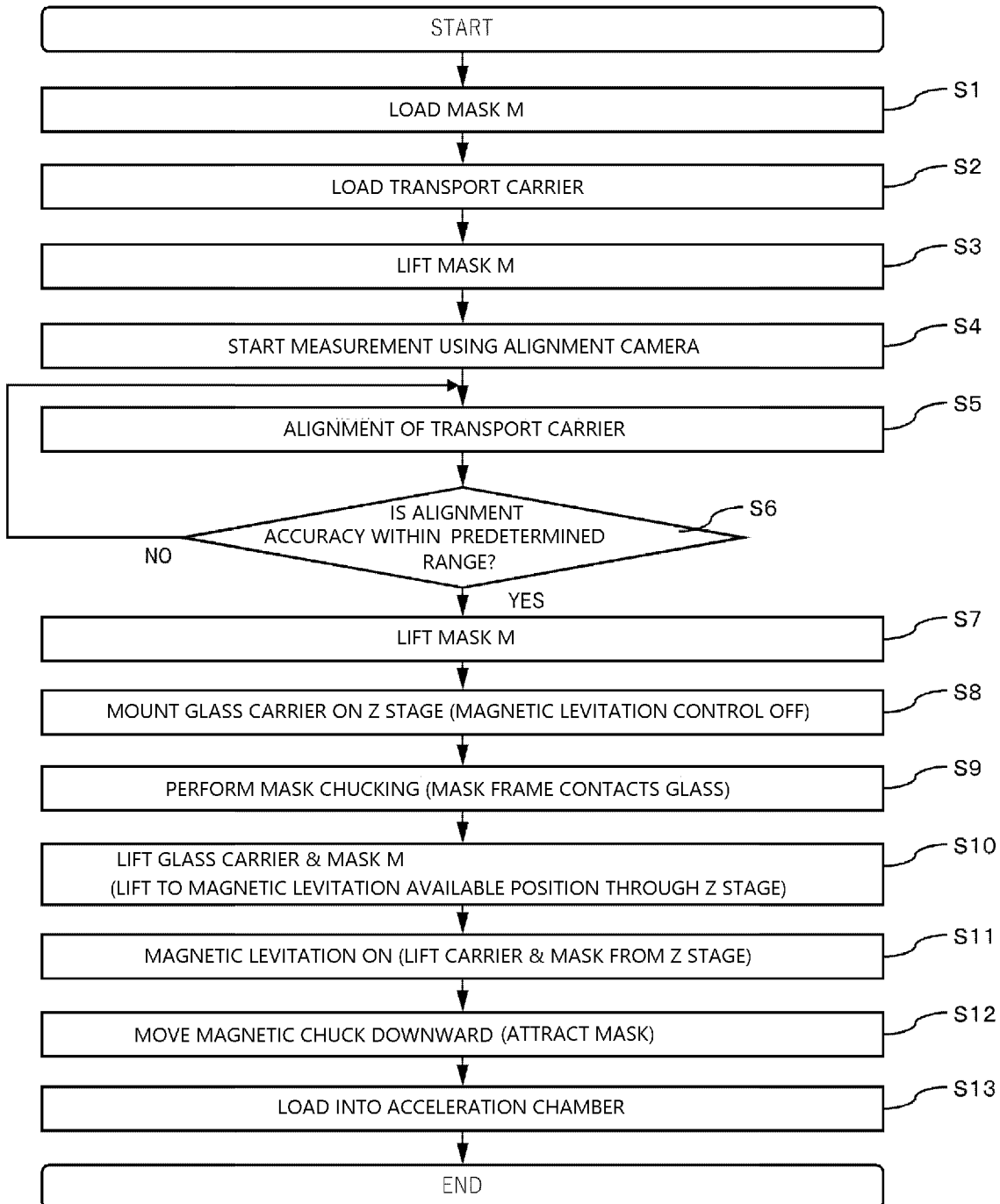
FIG. 9 is a flowchart showing an alignment process.

As shown in FIG. 8B, when the transport direction of the transport carrier 302 is defined as the X axis, a direction perpendicular to the X axis within a plane parallel to the plane of the glass substrate G is defined as the Y axis, and a direction perpendicular to the X axis and the Y axis is defined as the Z axis, the driving magnets 305a and 305b have an X-axis magnetic pole arrangement 305x in which two lines of magnets are disposed on each of left and right sides and magnetic poles of S poles and N poles are alternately disposed in the X-axis direction basically in order to obtain a propulsion in the X-axis direction. In addition, the driving magnets 305a and 305b include a Y-axis magnetic pole arrangement 305y in which magnetic poles of S poles and N poles are disposed in the Y-axis direction in order to obtain a propulsion in the Y-axis direction. This Y-axis magnetic pole arrangement is provided at two positions separated from each other in the X-axis direction in the left and right driving magnets 305a and 305b, which is a total of four positions. The Y-axis magnetic pole arrangement 305y is provided in one row in the magnets arranged in two rows on the left and right sides.

Although it will be described in detail later, position and posture control using the driving magnets 305a and 305b and the driving coils 306a and 306b can also be used for an operation of aligning the mask M with respect to the glass substrate G held by the transport carrier 302.

Mechanism for Holding Glass Substrate G and Mask M on Transport Carrier

Next, a mechanism for holding the glass substrate G on the transport carrier 302 and a mechanism for holding the mask M on the glass substrate will be described. According to the present invention, a glass substrate and a mask are respectively held by the electrostatic chuck 308 that is electrostatic chucking means and a magnetic chuck 307 as magnetic chucking means on the transport carrier in a superposed manner.

In FIG. 4, a chuck frame 309 in which the magnetic chuck 307 which magnetically chucks the mask M and the electrostatic chuck 308 which chucks the glass substrate G through an electrostatic force are accommodated in a superposed manner is attached to the lower surface of the carrier body 302A of the transport carrier 302 which has a rectangular frame shape, and an electrostatic chuck control unit (control box 312) including a control unit for electrifying the electrostatic chuck 308 is provided on the upper surface of the rectangular-shaped frame of the carrier body 302A.

It is possible to chuck and hold the glass substrate G by operating the control box 312 to electrify the electrostatic chuck 308 in the chuck frame 309.

The magnetic chuck 307 includes a chuck body 307x and two guide rods 307a extending from the rear side of the chuck body 307x (opposite the glass substrate G) to the carrier body 302A in the Z-axis direction, as shown in FIG. 3. These guide rods 307a are slidably inserted into cylindrical guides 307b provided in the frame of the carrier body 302A and can move up and down in the chuck frame 309.

The magnetic chuck 307 includes a connecting hook 307c serving as a connector which can be caught by or released from a driving side hook 307g provided at a driving side connection end of a connection end of a driving source provided outside. The chuck body 307x is driven in the up-and-down direction through the guide rods 307a according to engagement of the connecting hook 307c and the driving side hook 307g. The driving side hook 307g is controlled by an actuator 307h such as a driving device using a hydraulic pressure cylinder or a ball screw disposed outside the apparatus.

In the illustrated example, the connecting hook 307c is provided at a cap 307i fixed to the tip of each guide rod 307a and a positioning piece 307d extending laterally is provided on the cap 307i side. In contrast, on the carrier body 302A side, the positioning piece 307d can be selectively engaged with an upper lock piece 307f in contact with the upper end position of the chuck body 307x and a lower stopper 307e which locks the lower end position. The upper lock piece 307f can move in the horizontal direction between an engagement position at which it engages with the lower surface of the positioning piece 307d at the upper end position and a retraction position at which it is separated from the positioning piece 307d, and the positioning piece 307d can move downward at the retraction position and a downward movement position thereof is controlled by coming into contact with the lower stopper 307e. Although a downward movement limit is a position at which the mask M is magnetically chucked, a slight gap is provided between the chuck body 307x and the electrostatic chuck 308. Accordingly, the weight of the magnetic chuck 307 being applied to the electrostatic chuck 308 is avoided.

The upper lock piece 307f is also driven by an external driving force and can be moved in the horizontal direction if a pinion provided at the tip is rotated by a rotating actuator 307m and engaged with a transport upper lock piece 307 or a lack provided in a movable member of a linear guide, for example.

As shown in FIG. 4, the upper lock piece 307f is slidably supported on the upper surface of a pedestal 307j provided in the carrier body 302A through a pair of linear guides 307k separated from each other by a predetermined distance. The lower stopper 307e protrudes from the upper surface of the pedestal 307j between the linear guides 307k, and the positioning piece 307d is configured to have a width that can pass between the linear guides 307k such that it can move downward to come into contact with the lower stopper 307e when the upper lock piece 307f moves to the retraction position.

In addition, in a state in which the glass substrate G is held by the electrostatic chuck 308 of the chuck frame 309, the mask M is magnetically chucked having the glass substrate G and the electrostatic chuck 308 therebetween by moving the mask M close to the glass substrate G during alignment of the mask M with respect to the glass substrate G and moving the magnetic chuck 307 toward the mask M in a state in which the mask M is in contact with the glass substrate G. Accordingly, the glass substrate and the mask are chucked by the chuck frame 309 in a state in which the glass substrate and the mask have been aligned with each other and held by the transport carrier 302 as a result.

Next, the shapes of the electrostatic chuck 308 and the magnetic chuck 307 will be described with reference to FIG. 4. The chuck frame 309 is a rectangular member smaller than the carrier body 302A and constitutes a guide wall which holds the outer circumferential edge of the electrostatic chuck 308 and guides the magnetic chuck 307 and four sides of a support frame in a lattice form.

The electrostatic chuck 308 is a plate-shaped member such as a ceramic plate which applies a voltage to internal electrodes to chuck the glass substrate G using an electrostatic force acting between the glass substrate G and the electrostatic chuck 308 and is fixed to the lower edge of the chuck frame 309 such that it cannot move. As shown in FIG. 4, the electrostatic chuck 308 is divided into a plurality of chuck plates 308a (six chuck plates in the figure) and sides of the chuck plates 308a are fixed by a plurality of ribs 309b. The ribs 309b are divided into a plurality of ribs such that the support frame of the magnetic chuck 307 does not interfere with the ribs 309b.

The chuck body 307x of the magnetic chuck 307 has a configuration in which a rectangular frame body 307x1 includes a support frame 307x2 in a lattice form having a pattern corresponding to a shielding pattern formed on the mask M, and chucking magnets attached to the support frame 307x2 which are not shown. The chucking magnets are configured in such a manner that magnets of S poles and N poles are alternately arranged linearly along the lattice through yoke plates 307x3 on the support frame 307x2.

In addition, mask chucks 311 as mask holding means for holding the mask M are provided at a plurality of positions (10 positions in the embodiment) around the chuck frame 309 on the lower surface of the transport carrier 302 in addition to the magnetic chuck 307. The mask chucks 311 are components driven by an external driving force and a driving source therefor is not mounted in the transport carrier 302.

Figure 5A:
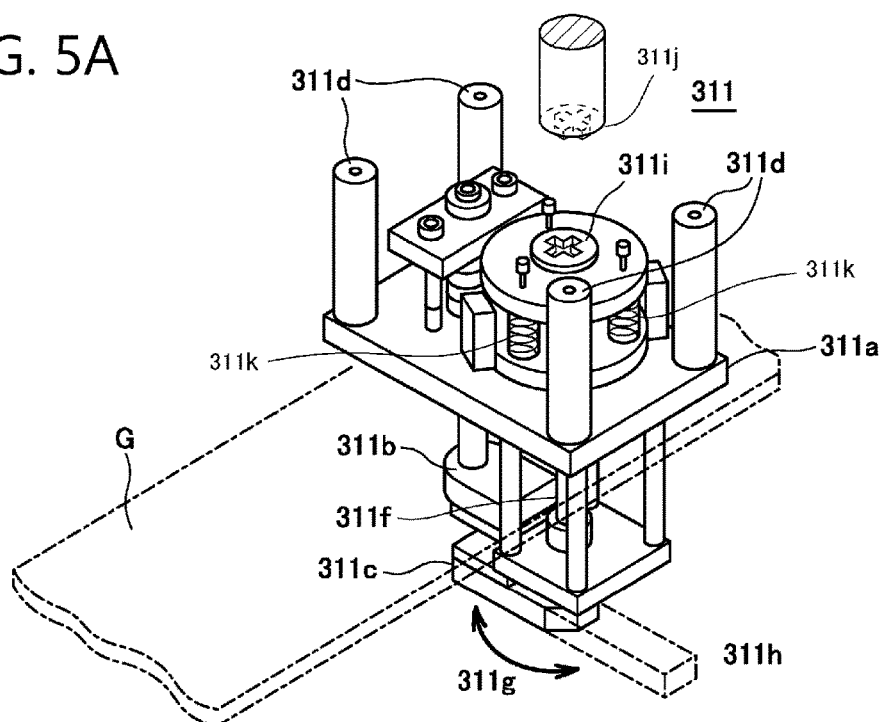
FIG. 5A is a schematic diagram showing a mask chuck and FIG. 5B is a schematic diagram of the transport carrier.
Figure 5B:
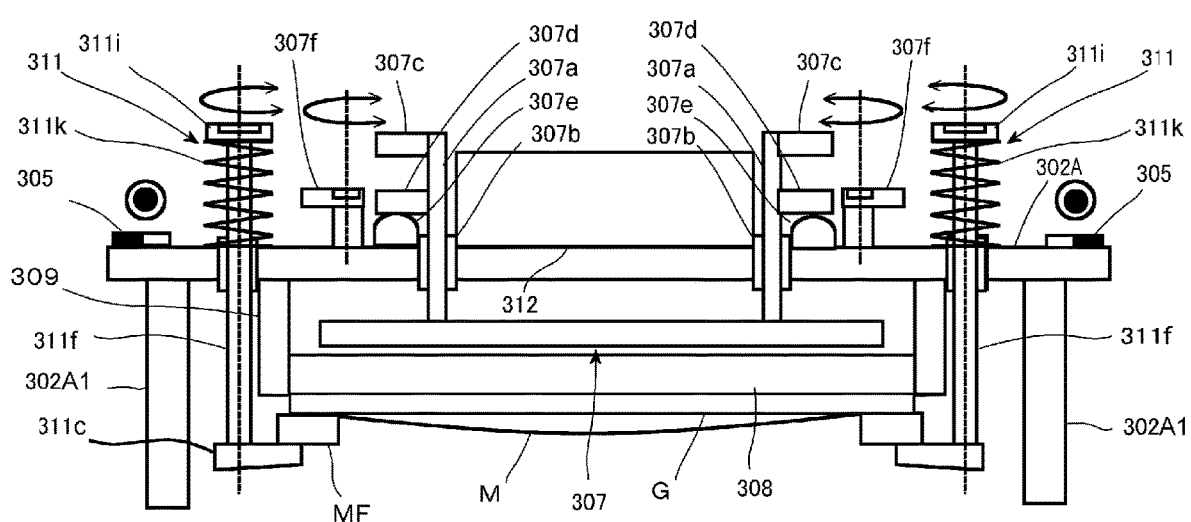

FIGS. 5A and 5B show the structure of each mask chuck 311. As shown, the mask chuck 311 includes chuck pieces 311b and 311c which are provided on a base 311a attached to the lower surface of the transport carrier through four support columns 311d and clip a mask frame MF at the circumference of the mask M above and under the mask. The upper chuck piece 311b is disposed at a position in contact with the upper surface of the mask frame MF at the circumference of the mask M and the lower chuck piece 311c can rotate on a rotating shaft 311f in a direction of arrow 311g. That is, the lower chuck piece 311c can move to the illustrated clipping position at which it clips the mask frame MF along with the upper chuck piece 311b and a retraction position 311h at which it is separated from the mask frame MF and thus does not obstruct upward or downward movement of the mask frame. Such movement is performed by rotating the rotating shaft 311f according to connection of a connecting part 311i to a connecting end 311j of a driving side which extends from the actuator 311m (refer to FIG. 3A) disposed outside into the chamber.

Further, the rotating shaft 311f includes biasing members 311k which elastically bias the chuck piece 311c to the transport carrier in a state it clips the mask frame MF along with the chuck piece 311b. It is possible to securely hold the mask M on the transport carrier 302 and prevent a positional deviation using a biasing force of the biasing members 311k.

The mask chuck 311 moves to the retraction position before a mask is mounted. When the mask M is lifted to the lower surface of the transport carrier 302 through a lifting device which will be described later and comes into contact with the glass substrate G, the mask chuck 311 is driven by the actuator shown in FIG. 3A through the connecting part 311i such that the chuck piece 311c rotates to the mask and the glass substrate, locks the circumferential edge of the mask and is elastically chucked to the transport carrier 302.

Further, since the mask chucks 311 clip and hold the glass substrate G by locking the mask frame MF at the circumference of the mask M, a state in which the glass substrate G and the mask M have been mounted and held in a superposed manner can be maintained even if the electrostatic chuck 308 releases the glass substrate G and the magnetic chuck 307 releases the mask M later.

FIG. 5B is a schematic diagram conceptually showing the transport carrier. Functional parts the same as those in FIG. 3A are denoted by the same reference signs.

That is, the electrostatic chuck 308 is used to hold the glass substrate G on the transport carrier 302, the magnetic chuck 307 is used to hold the mask M, and both chucks are incorporated into the chuck frame 309. Holding of the mask M through the magnetic chuck 307 is performed through ascending and descending operations of the magnetic chuck 307 in the chuck frame 309. Although the upper lock piece is moved in the horizontal direction in FIGS. 3A to 3C, it is rotated in FIGS. 5A and 5B. Both horizontal movement and rotation are possible if locking and unlocking can be performed. After holding by the magnetic chuck 307 is achieved, the mask frame MF is held on the carrier body 302A through the mechanical mask chucks 311. The biasing members 311k such as springs for pressurization are incorporated into the mask chuck 311 and elastically held. These three chucks of the electrostatic chuck 308, the magnetic chuck 307 and the mask chucks 311 are compactly incorporated into the transport carrier 302.

In addition, the control box 312 which controls the electrostatic chuck 308 of the glass substrate G is incorporated into the transport carrier 302 along with a charging type power supply, includes wireless communication means for communicating commands from a control system, and need not be connected to an external power supply cable, a communication cable and the like in the entire manufacturing process.

Control Box

A configuration and function of a control box of an electrostatic chuck will be described with reference to FIG. 14. To use the electrostatic chuck, it is necessary to supply power to the electrostatic chuck and transmit a control signal thereto. However, when a wired cable is used for power supply and communication, a degree of freedom in movement of the transport carrier may decrease. Accordingly, the transport carrier 302 includes a control box for supplying power and transmitting a control signal to the electrostatic chuck in a noncontact manner.

Figure 14:
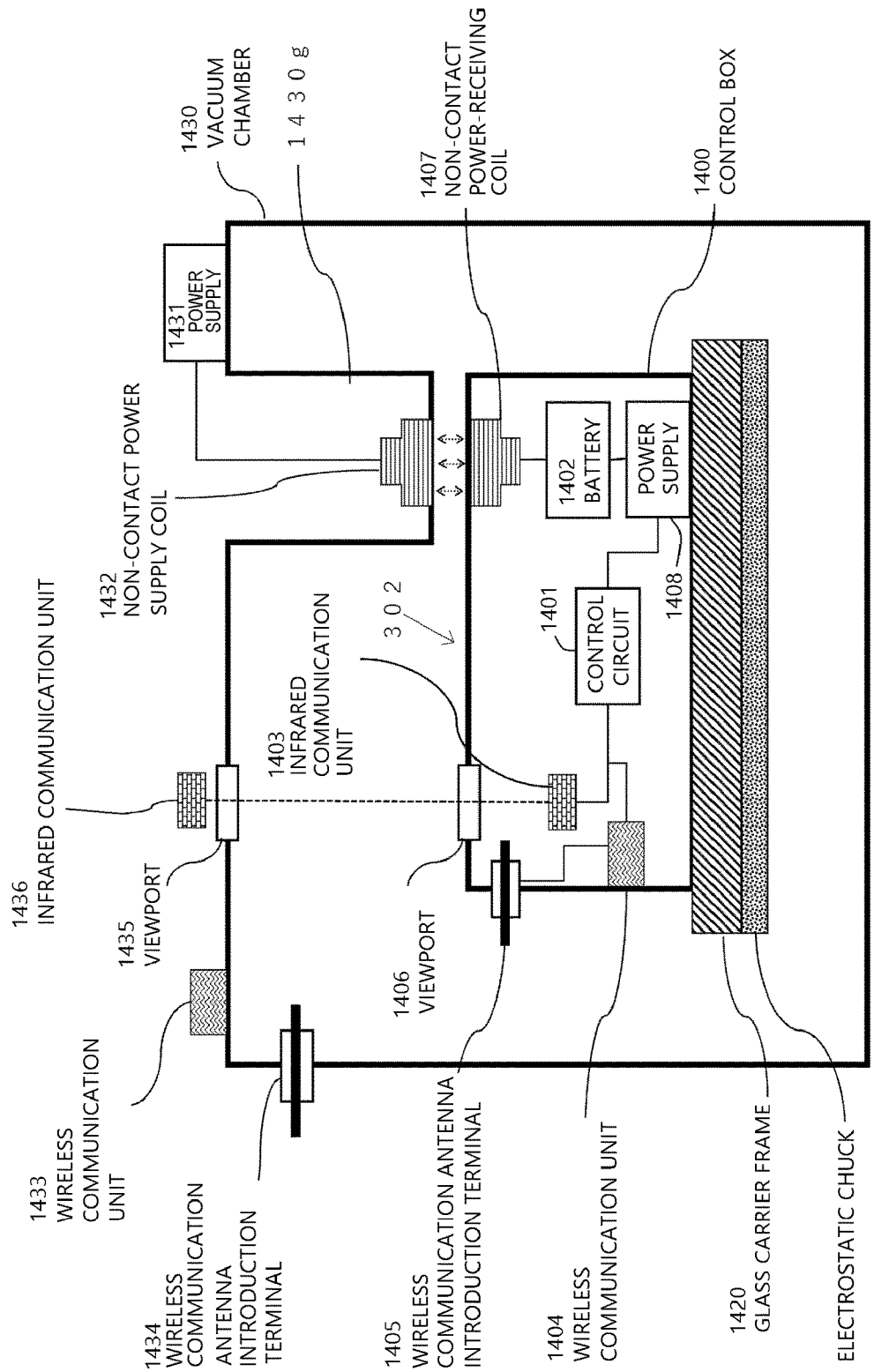
FIG. 14 is a schematic diagram describing a control box.

FIG. 14 schematically shows an arrangement and configuration of a control box in a deposition apparatus. The transport carrier 302 is transported by the transport module 301 in a vacuum chamber 1430 maintained to a predetermined vacuum degree. Here, the vacuum chamber 1430 may be any chamber in the manufacturing line 100. The transport carrier 302 includes the electrostatic chuck 308 held by a glass carrier frame 1420. In addition, various structures including a control box 1400 are disposed on the transport carrier when the transport carrier is viewed from above when a surface of a substrate on which a film will be formed faces downward as shown in FIG. 14. The inside of the control box is maintained at atmospheric pressure and sealed from the vacuum chamber 1430. The control box 1400 includes a control circuit 1401, a battery 1402, an infrared communication unit 1403, a wireless communication unit 1404, a wireless communication antenna introduction terminal 1405, a viewport 1406, a non-contact power-receiving coil 1407, a power supply 1408, and the like.

The vacuum chamber includes a power supply 1431 and a non-contact power supply coil 1432 in order to supply power to the control box. Further, the vacuum chamber includes a wireless communication unit 1433, a wireless communication antenna introduction terminal 1434, a viewport 1435 and an infrared communication unit 1436 for communication.

Power supply from the outside to the control box 1400 is performed through a non-contact power supply method such as electromagnetic induction using coils or magnetic field resonance. Magnetic fields change when the power supply 1431 (e.g., a DC 24V power supply) provided outside the vacuum chamber supplies a current to the non-contact power supply coil 1432 and thus a current is generated in the non-contact power-receiving coil 1407 in the control box and accumulated in the battery 1402 (e.g., a lithium ion battery). Accordingly, power necessary for the operation of the power supply 1408 (e.g., a 2 kV high-voltage power supply) for the electrostatic chuck can be secured. Since a distance between coils needs to decrease to be equal to or less than a certain degree in order to realize non-contact power supply, the non-contact power supply coil 1432 may be disposed at a position as close to the transport carrier as possible by forming a hole 1430*g* or the like.

Meanwhile, it is also desirable to dispose a capacitance sensor for detecting capacitance variation in case of a problem such as short-circuiting of the electrostatic chuck circuit and performing interlocking, a barometer for detecting an atmospheric leak from the control box and performing interlocking, and the like in the control box 1400. It is desirable that the power supply 1431 and the non-contact power supply coil 1432 on the vacuum chamber side be disposed at various positions on the manufacturing line, and particularly, it is desirable that they be disposed at a position at which the transport carrier stands by.

In addition, communication between the control box 1400 and the outside is also performed through a non-contact method such as infrared or wireless communication. As components for wireless communication, the control box includes the wireless communication unit 1404 and the wireless communication antenna introduction terminal 1405 and the vacuum chamber also includes the wireless communication unit 1433 and the wireless communication antenna introduction terminal 1434. As components for infrared communication, the control box includes the infrared communication unit 1403 and the viewport 1406 and the vacuum chamber also includes the infrared communication unit 1436 and the viewport 1435. Each viewport is an opening for infrared communication and is formed of a material through which infrared rays pass. In addition, each wireless communication antenna introduction terminal has a sealing component for maintaining the internal pressure of the vacuum chamber or the control box. Accordingly, the electrostatic chuck can be operated through remote communication. Since power supply and communication with respect to the electrostatic chuck can be performed in a non-contact manner using the control box having the above-described configuration, decrease in a degree of freedom in movement of the transport carrier and a trouble in a connection part can be avoided.

Manufacturing Processes

Next, a process of actually fixing the mask M to the glass substrate G, vacuum depositing an organic EL light-emitting material thereon in the deposition chamber and unloading the mask M and the glass substrate G will be described.

FIG. 1 shows movement positions of the transport carrier 302 (electrostatic chuck 308) which transports the glass substrate G and the mask M for respective manufacturing processes in the manufacturing line 100 for an organic EL panel, as described above. Although the transport carrier is illustrated at each movement position for control in manufacturing processes in the figure for facilitation of understanding, the number of transport carriers actually introduced to the transport path is not limited to the illustrated number. The number of simultaneously introduced transport carriers is determined by manufacturing process design and tact time. Furthermore, although the transport carrier and the like move counterclockwise on the manufacturing line in the figure, the movement direction is not limited thereto.

A magnetic driving method (linear motor method) is employed for propulsion in the transport direction of the transport carrier 302 in the manufacturing line 100. In addition, any of magnetic levitation and support of guides by rollers is used for supporting the transport carrier 302 in the vertical direction. As described above, little waste and dust are generated when the transport carrier 302 is magnetically levitated and transported and thus this is considerably effective for transport in apparatuses which require a high vacuum degree and cleanness degree such as organic EL panel manufacturing apparatuses.

In the figure, parts in which a positional relationship of components changes are denoted by reference signs P1 to P8 as described below.

P1: a glass substrate loading position at which the glass substrate G is held on the transport carrier P2: a mask mounting position at which the mask M is mounted on the glass substrate G on the transport carrier P3: a mask separation position at which the mask M is separated from the glass substrate G after deposition processing P4: a substrate unloading position at which the glass substrate G is separated and unloaded from the transport carrier 302 after deposition processing P5: a carrier transfer position at which the vacant transport carrier 302 from which the glass substrate G has been unloaded is transferred to the return transport path P6: a mask transfer position at which the mask M separated after deposition processing is mounted on the transport carrier 302 on the return transport path P7: a mask return position at which the mask M is separated from the transport carrier 302 being transported on the return transport path and transported to the mask mounting position P2

P8: a carrier return position (end point of the return transport path) at which the transport carrier 302 from which the mask M has been separated is shifted from the return transport path to the glass substrate loading position P1 on the transport path for deposition processing While the transport carrier 302 is moved by the transport module 301 on the manufacturing line 100, a lamination relationship of the glass substrate G, the mask M, the electrostatic chuck 308 included in the transport carrier, and the like change or upper and lower layers are reversed 180° according to flipping processing at various positions on the manufacturing line. Accordingly, to aid in understanding a vertical positional relationship of the glass substrate G, the mask M and the electrostatic chuck 308, each principal position is denoted by a reference sign in FIG. 1. That is, a case in which a surface of the glass substrate G on which a film will be formed (film formation surface) is uppermost is denoted by reference sign G1 and a case in which a surface of the glass substrate G on which no film will be formed is uppermost is denoted by reference sign G2. In addition, a case in which the substrate chucking side of the electrostatic chuck 308 is uppermost is denoted by reference sign C1 and a case in which the side that does not chuck the substrate is uppermost is denoted by reference sign C2. Furthermore, a case in which a film formation side of the mask M is uppermost is denoted by reference sign M1 and a case in which a side on which a film is not formed is uppermost is denoted by reference sign M2. Reference signs represent a state after flipping or reversal in each flip chamber and represent a state after loading and unloading in the loading chamber and the unloading chamber.

Loading Process

The glass substrate G is loaded from an external stocker to the substrate loading chamber 101 on the deposition process transport path 100*a* at the glass substrate loading position P1 and held by the electrostatic chuck at a predetermined holding position on the transport carrier 302. At the glass substrate loading position P1, the transport carrier 302 and the transport module 301 supporting the transport carrier 302 are disposed such that the transport module 301 is under the transport carrier 302. Here, a glass substrate holding surface (chuck surface) of the transport carrier 302 faces upward. The glass substrate G is loaded at the glass substrate loading position P1 from above in the vertical direction and mounted on the chuck surface. At this time, the film formation surface of the glass substrate G faces upward in the vertical direction.

Subsequently, the transport carrier 302 holding the glass substrate is transported from the glass substrate loading position P1 to the flip chamber 102. This transport is performed in the roller transport mode. That is, the transport carrier 302 moves in the progress direction using a magnetic force generated between the driving coils 306a and 306b to which a current or a voltage has been applied and the driving magnets 305a and 305b while the guide grooves 303 are in contact with the roller bearings 304a and 304b serving as guides.

Flipping and Mode Switching Process

In the flip chamber 102, a rotation supporting mechanism as a flip means rotates the transport module 301 supporting the transport carrier 302 holding the glass substrate 180° in the progress direction. Accordingly, the vertical positional relationship between the transport carrier 302 and the transport module 301 is reversed and thus the glass substrate G faces downward. And, the face formation surface of the glass substrate G faces downward in the vertical direction. The rotation supporting mechanism can rotate the transport module 301 by 180° in the progress direction together with the transport carrier 302. It is desirable that a rotation axis be disposed at the position of a center of gravity such that the positions of the transport carrier 302 and the transport module 301 do not deviate during the rotating operation. In the figure, reversal of the transport carrier 302 and the transport module 301 in the progress direction is denoted by arrow R. Meanwhile, it is desirable to use a lock mechanism which mechanically locks the transport module 301 and the transport carrier 302.

Here, a reason for rotation of the transport carrier 302 together with the transport module 301 is that the roller bearings 304a and 304b arranged on both sides of the transport module are inserted into the guide grooves 303a and 303b of the transport carrier in order to guide the transport carrier 302. Another reason is that an arrangement of magnets on the transport carrier side and a guide mechanism of the transport module become complicated although a reversal weight decreases when a structure in which only the transport carrier is reversed is used because the magnets on the transport carrier side and the coils on the transport module side are in a positional relationship in which they face each other.

After flipping processing in the flip chamber, the current or the voltage applied to the driving coils is controlled such that a method for supporting the transport carrier 302 is switched from contact between the roller bearings 304a and 304b and the guide grooves 303a and 303b to magnetic levitation. Accordingly, a control mode switches from the roller transport mode to the magnetic levitation transport mode. Subsequently, the transport carrier 302 moves to the alignment chamber 103 (mask mounting position P2) in the magnetic levitation transport mode.

Alignment Process

FIGS. 6A to 6C are diagrams for describing a mask lifting device which performs a mask chuck operation in the alignment chamber 103 and the operation thereof.

In the alignment chamber 103, the transport module 301 is fixed to a main frame 200 in the chamber and the transport carrier 302 is maintained in a state in which it is suspended from the transport module 301 according to magnetic levitation in a state in which the glass substrate G held by the electrostatic chuck faces downward.

As shown in the same figure, a lifting device 202 which holds and lifts the mask M is provided under the transport carrier 302. The lifting device is configured to support the four front, rear, left and right points of a mask tray 205 by lifting rods 204a, 204b, 204c and 204d which are moved up and down by jacks 203a, 203b, 203c and 203d to control the mask tray 205 such that the mask tray 205 moves up and down.

In addition, the mask tray 205 is configured to support the mask frame MF at the circumference of the mask M by a plurality of mask supporters 206, as shown in FIG. 6C.

According to the above-described configuration, the mask M mounted on the mask tray 205 is lifted by the jacks 203a to 203d and moved close to the glass substrate G held on the magnetically levitated transport carrier 302, and when the mask M is within a predetermined distance from the glass substrate G, an alignment operation is performed on the glass substrate G and the mask M.

The alignment operation images alignment marks formed in advance on the glass substrate and the mask using an alignment camera to detect a positional deviation amount and direction of the glass substrate and the mask and performs alignment while slightly moving the position of the transport carrier through a transport driving system of the magnetically levitated transport carrier 302 such that the mask M is chucked by the electrostatic chuck and held on the transport carrier in a state in which the positions of the glass substrate and the mask have been correctly aligned with each other.

This holding state is locked by the mask chucks 311 at ten positions as described above, and even if the electrostatic chuck and the magnetic chuck are released later, a state in which the glass substrate and the mask have been aligned with each other and held on the transport carrier is maintained.

Here, the position of the transport carrier 302 with respect to the transport module 301 is finely adjusted in a state in which the transport carrier 302 is magnetically levitated during alignment. Accordingly, the present invention is also effective for simplifying the configuration of the transport carrier 302 and reducing the weight thereof because alignment can be performed through the transport carrier driving system without additionally providing a fine adjustment mechanism dedicated for alignment.

Details of Alignment

Figure 13A:
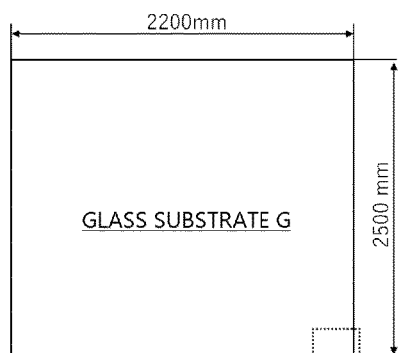
FIGS. 13A to 13C are explanatory diagrams of alignment.
Figure 13B:
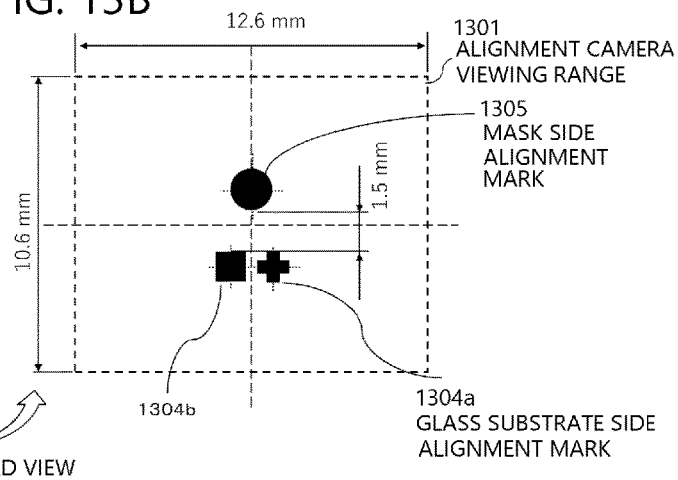

The above-described method for imaging the alignment marks and performing alignment will be described in detail. FIG. 13A is a schematic diagram of the glass substrate G and FIG. 13B is an enlarged diagram of alignment marks provided at corners of the glass substrate G and the mask M. An alignment camera viewing range 1301 is set at four corners of the glass substrate G shown in FIG. 13A. FIG. 13B shows a state in which the mask M is superposed on the glass substrate G and imaged in one alignment camera viewing range 1301 and represents an alignment mark 1304 on the glass substrate side, and an alignment mark 1305 on the mask side which has been imaged through the glass.

Figure 13C:
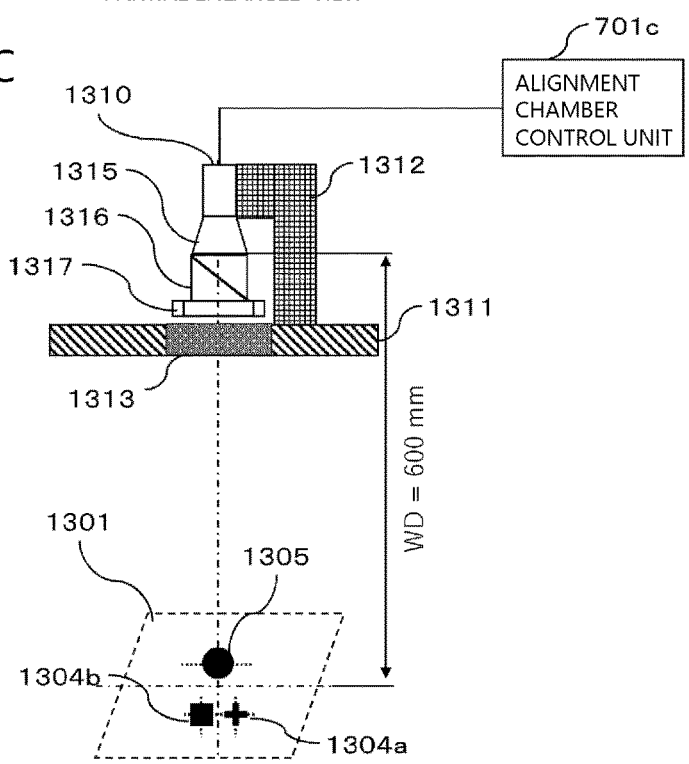

FIG. 13C is a conceptual diagram of an alignment system. An alignment camera 1310 is disposed on a top plate 1311 of the alignment chamber. The alignment camera may be a camera which can perform optical imaging, and a camera having a sensor seize of ⅔ inches can be used, for example. A viewport 1313 through which light used for imaging can be transmitted in the optical axis direction of the alignment camera 1310 is provided at the top plate 1311 of the chamber. The alignment camera is installed on a stage 1312 and can perform fine adjustment of positions. As a stage, for example, a 6-axis adjustment stage can be used. The camera may additionally include various members necessary for imaging, such as a lens 1315, a quasi-coaxial verification 1316 and a ring light 1317 as components.

As control means, the alignment chamber control unit 701*c* as shown may be used or other control devices may be used. The alignment chamber control unit 701*c* performs alignment processing on the basis of image data captured by the alignment camera 1310. That is, the alignment chamber control unit 701*c* extracts the alignment mark 1305 on the mask side and the alignment mark 1304 on the glass substrate side from the image data through image processing and calculates a positional deviation amount and a positional deviation direction of the alignment marks 1305 and 1304. If the positional deviation amount and the positional deviation direction are within predetermined ranges, the position of the transport carrier 302 is finely adjusted using a magnetic force and the glass substrate G and the mask M are aligned with each other on the basis of the calculated positional deviation amount and the like.

Configuration of Magnet

Here, a configuration for allowing an alignment operation using a magnetic force will be described. FIGS. 8A and 8B show the driving magnets 305*a* and 305*b* disposed on the upper surface of the transport carrier 302 in detail. The driving magnets 305*a* and 305*b* are paired and disposed on the left and right sides with respect to the transport direction. The driving magnets 305*a* and 305*b* basically constitute magnet arrays in which magnets with an N pole and magnets with an S pole are alternately disposed linearly. In the illustrated example, the driving magnets 305*a* and 305*b* paired on the left and right sides include magnet arrays in two rows. N poles and S poles are alternately arranged in a line basically in each of the magnet arrays in two rows and used for control in the X direction (transport direction) in the figure. In addition, both N poles and S poles are disposed such that they are exposed to the side facing the transport module 301 in parts of the magnet arrays and used for control in the Y direction (direction perpendicular to the transport direction) in the figure as well as the X direction.

Arrays composed of a plurality of driving coils 306*a* and 306*b* are provided at positions facing the magnet arrays of the transport carrier 302, and the transport carrier 302 can be moved in the X-axis direction (transport direction), Y-axis direction (direction perpendicular to the transport direction) and Z-axis direction (direction in which the transport carrier faces the transport module) in FIG. 8 and a rotation direction around each axis by controlling a current or a voltage of each coil. Particularly, to control the Y-axis direction and the rotation direction around the Z axis, it is effective to dispose the driving magnets 305*a* and 305*b* such that at least one of the driving magnets 305*a* and 306*b* is arranged in a plurality of rows.

Processing Flow

The alignment operation in the alignment chamber 103 will be described in detail with reference to a flowchart of FIG. 9 and FIGS. 10 to 12. FIGS. 10A to 12D respectively correspond to steps S1 to S5 and S7 to S12 of FIG. 9.

First, the mask M is loaded from a pre-alignment chamber 100*g* by the mask transfer mechanism 100*e* in step S1, as shown in FIG. 10A. The alignment chamber control unit detects completion of loading through a sensor provided in the alignment chamber 103.

Subsequently, the transport carrier 302 holding a substrate is loaded into the alignment chamber 103 from the flip chamber 102 in the magnetic levitation transport mode in step S2, as shown in FIG. 10B. Here, a transport direction A is a direction from the back to the front. The alignment chamber control unit detects the position from an encoder value of the transport module 301 and stops the transport carrier 302 at a predetermined alignment position. Here, the clearance (gap) between the mask M and the glass substrate G is defined as CLS2. For example, CLS2=68 mm.

Subsequently, the mask M is lifted by the lifting device 202 (the jacks 203*a* to 203*d* and the lifting rods 204*a* to 204*d*) and stopped immediately before it comes into contact with the glass substrate G in step S3, as shown in FIG. 10C. The stop position is a position at which the alignment camera can simultaneously measure alignment marks of the glass substrate G and the mask M in the next step S4. Here, when the clearance between the mask M and the glass substrate G is defined as CLS3, CLS3=3 mm, for example.

Subsequently, the alignment marks of the glass substrate G and the mask M are simultaneously measured by the alignment camera 1310 in step S4, as shown in FIG. 10D. Meanwhile, a through-hole is formed in the transport carrier 302 along an optical axis direction of the alignment camera. The alignment camera can measure the alignment marks provided on the glass substrate G and the mask M through the through-hole. Further, a notch and the like, for example, may be used instead of the through-hole if they can be measured as alignment marks.

Figure 11B:
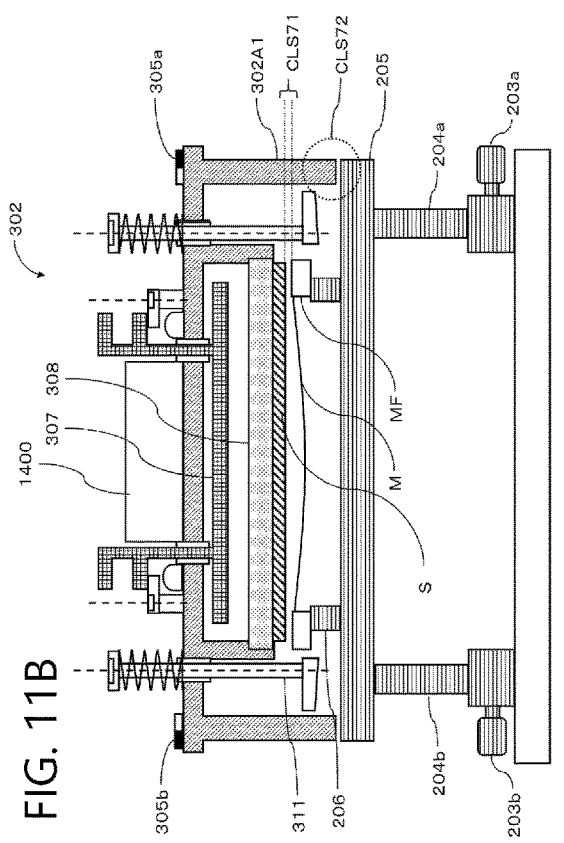
FIGS. 11A to 11D are schematic diagrams showing procedures of respective steps of the progress of alignment.
Figure 11A:
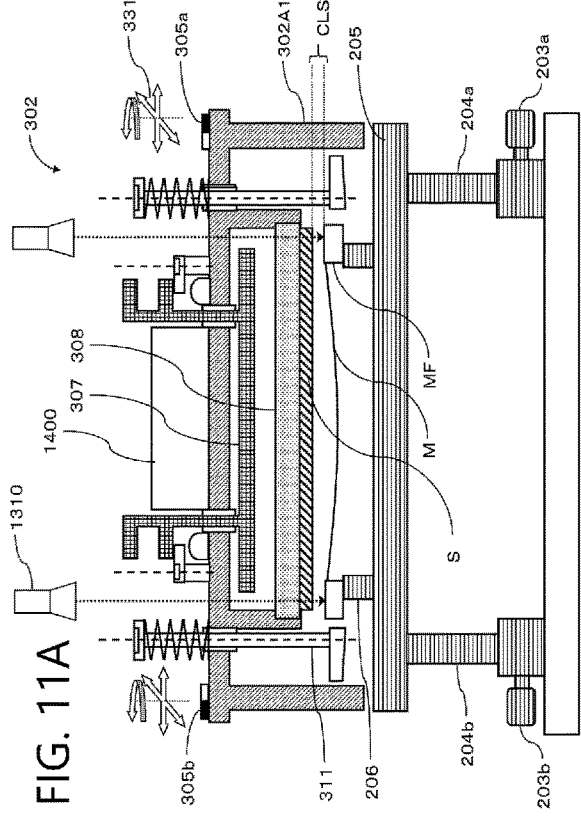

Subsequently, the alignment chamber control unit calculates a positional deviation amount of the glass substrate G and the mask M from the measurement result in S4 and adjusts the position of the transport carrier 302 holding the glass substrate G such that a positional deviation value is within a predetermined tolerance in step S5, as shown in FIG. 11A. When position adjustment is performed, a magnetic force between the driving magnets 305*a* and 305*b* is adjusted by controlling a current or a voltage applied to the driving coils 306*a* and 306*b*, as denoted by reference sign 331. In this manner, the alignment operation of this step is performed in a state in which the transport carrier 302 has been levitated. Subsequently, the alignment camera performs measurement again and the alignment chamber control unit determines whether the positional deviation value is within a predetermined range in step S6. If the positional deviation value is not within the range, the process returns to S5 and alignment is repeated until the positional deviation value is included within the range.

As described above, the alignment operation of this flow is performed by adjusting the position of the transport carrier using a magnetic force in a state in which the transport carrier and the glass substrate G held thereby have been magnetically levitated. In this configuration, since the transport carrier does not come into contact with the transport module, an influence such as from friction is curbed and positioning with high accuracy can be performed. Furthermore, it is not necessary to provide additional driving means for alignment because a magnetic force generated by the driving coils and the driving magnets for transporting the transport carrier is used for alignment. As a result, it is possible to simplify the apparatus configuration and reduce costs.

When the alignment operation is completed, the process enters a process of magnetically chucking the mask M, but the mask frame MF is chucked by the mask chuck 311 first in this embodiment.

That is, the mask M is lifted close to the glass substrate G in S7, as shown in FIG. 11B. When the mask M is lifted, the mask M supported by the mask supporters 206 is lifted by lifting the mask tray 205 through the lifting device 202. The mask M has been bent as schematically shown, and the mask frame MF supported by the mask supporters 206 is lifted and moved close to the glass substrate G with a predetermined gap therebetween. Here, when the clearance between the mask M and the glass substrate G is defined as CLS71, CLS71=0.5 mm, for example. Since the transport carrier 302 is magnetically levitated, a clearance CLS72 is present between the lower end of a carrier stand 302A1 and the mask tray 205.

Figure 11D:
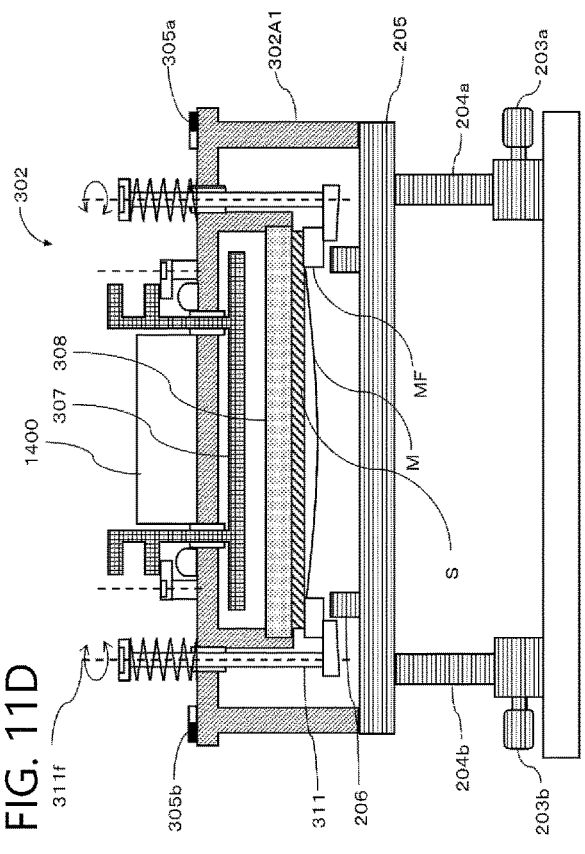
Figure 11C:
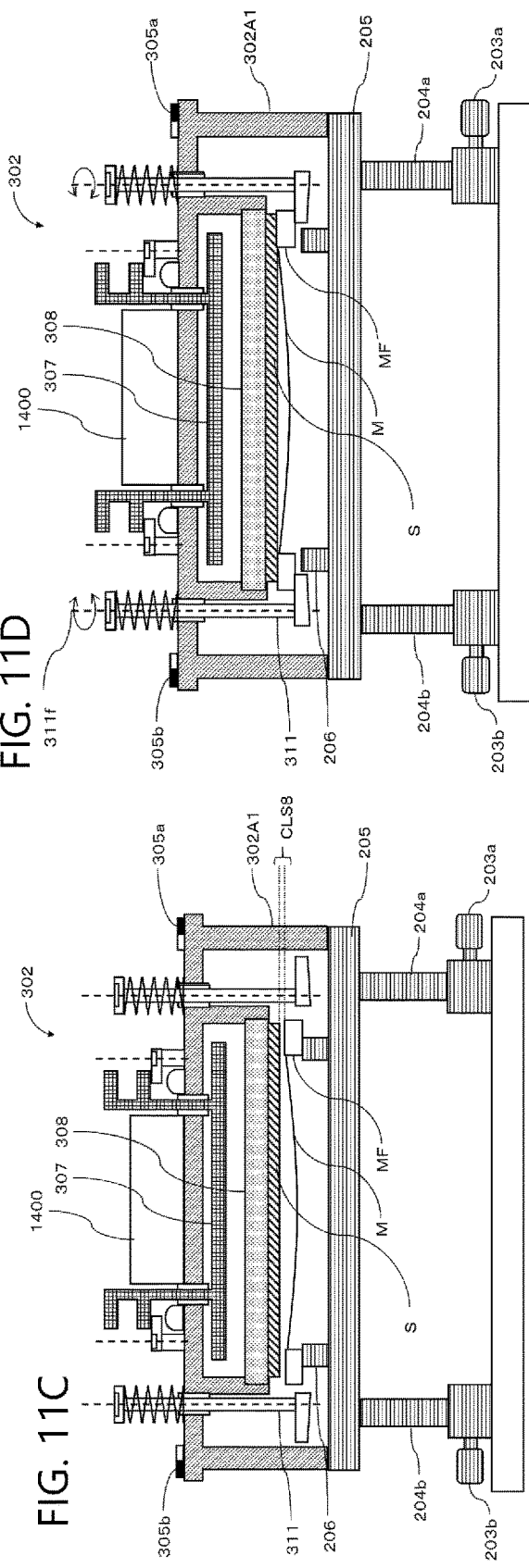

Subsequently, magnetic levitation control is turned OFF and the transport carrier 302 is mounted on the mask tray 205 in S8, as shown in FIG. 11C. When magnetic levitation control is turned OFF, the transport carrier 302 loses the levitation force and thus drops due to the weight thereof and is mounted on the mask tray 205. In the illustrated example, the lower end of the carrier stand 302A1 provided in the carrier body 302A comes into contact with the mask tray 205. Here, when the clearance between the mask M and the glass substrate G is defined as CLS8, CLS8=0.3 mm, for example.

Subsequently, mask chucking is carried out in S9, as shown in FIG. 11D.

That is, the rotating shaft 311f is rotated by an external driving device such that the chuck piece 311c is engaged with the mask frame MF and chucked. In the illustrated example, the upper chuck piece 311b is omitted. At this time, the mask frame MF is fixed. This state is maintained even when the electrostatic chuck 308 and the magnetic chuck 307 are released.

Subsequently, the transport carrier 302 is lifted to a levitation start position in a state in which the mask M is held by the mask chucks 311 in S10, as shown in FIG. 12A. Lifting of the transport carrier 302 is performed by the mask tray lifting device. The levitation start position is a distance at which a gap between the driving coils 306 of the transport module 301 and the driving magnets 305 of the transport carrier 302 allows a degree of attractive force by which the transport carrier 302 can be levitated. In this step, the transport carrier 302 may be lifted by about 0.7 mm, for example.

Subsequently, magnetic levitation control is turned ON and the transport carrier 302 holding the mask M is lifted from the mask tray 205 in S11, as shown in FIG. 12B. That is, the transport carrier 302 levitates from the mask tray 205 by a predetermined amount according to the attractive force between the driving coils 306 of the transport module 301 and the driving magnets 305 of the transport carrier 302. A lifting amount may be about 0.5 mm, for example. That is, when the clearance between the mask tray 205 and the lower end of the carrier stand 302A1 of the transport carrier 302 here is defined as CLS11, CLS11=0.5 mm, for example.

Subsequently, the magnetic chuck 307 moves downward to magnetically chuck the mask M in S12, as shown in FIG. 12C. That is, lock pieces locked at the lifting end are rotated by an external actuator and moved to a retraction position and thus locking in the downward movement direction is released, the magnetic chuck 307 moves downward to the electrostatic chuck 308 holding the glass substrate G and clips the electrostatic chuck 308 and the glass substrate G, and chucking magnets of the magnetic chuck 307 and the mask M are magnetically chucked and held. Accordingly, the complete aligned mask M comes into contact with the film formation surface of the glass substrate G and is held.

Meanwhile, downward movement of the magnetic chuck 307 is realized by a driving force from the outside of the transport carrier 302. Here, a downward movement amount of the magnetic chuck may be 30 mm, for example.

Subsequently, the transport carrier 302 is unloaded from the alignment chamber 103 to the acceleration chamber 104 in the transport direction A in S13, as shown in FIG. 12D.

According to the above flow, the transport carrier 302 is unloaded in a state in which the aligned mask M is held by the magnetic chuck 307 on the film formation surface of the glass substrate G that has been held by the electrostatic chuck 308 and the mask frame MF has been chucked by the mask chucks 311.

Deposition Process

Description will be continued by referring back to FIG. 1. The transport carrier unloaded from the alignment chamber 103 after completion of the alignment operation is accelerated in the acceleration chamber 104 as described above and loaded into the deposition chamber 105. It is possible to compensate for a time delay required for high-accuracy alignment processing in the alignment chamber 103 and prevent a tack time deterioration by accelerating the transport carrier before the transport carrier is loaded into the deposition chamber 105.

Vacuum deposition of an organic EL light-emitting material is performed while the transport carrier is moving in a direction of arrow B in a state in which the transport carrier has been magnetically levitated at a predetermined deposition speed in the deposition chamber. In this manner, the magnetic levitation transport mode is used when the transport carrier is loaded into the acceleration chamber and the deposition chamber from the alignment chamber and when the transport carrier moves in the deposition chamber, and thus a high-quality film can be formed because generation of dust and generation of particles caused by friction can be prevented.

Separation and Unloading Process

The transport carrier unloaded from the deposition chamber 105 after deposition processing ends is decelerated in the deceleration chamber 106, transported to the mask separation chamber 107 at the mask separation position P3 and stopped at a predetermined position. Here, the state in which the mask M is locked by the mask chucks 311 is released and the mask M is separated from the glass substrate.

The separated mask M is moved downward using the same mechanism as the mask lifting device of FIGS. 6A to 6C. The mask transfer mechanism 100c receives and holds the mask M which has been moved downward by a holding frame and transports the mask M to a retraction position between the deposition process transport path 100a and the return transport path 100b. Then, when the vacant transport carrier 302 after substrate unloading moves to the mask transfer position P6 on the return transport path, the mask M is moved to a position under the transport carrier. Then, the mask M is lifted to the lower surface of the transport carrier by the same mechanism as the mask lifting device and held to a magnetic chuck. In this manner, the transport carrier 302 holding the mask M is returned to a supply side.

On the other hand, the transport carrier 302 from which the mask M has been separated in the mask separation chamber 107 moves to the flip chamber 108 while holding the glass substrate G through engagement part of the mask chucks. In the flip chamber 108, the same rotation supporting mechanism as that of the flip chamber 102 of the supply side rotates the transport carrier 302 by 180° in the progress direction together with the transport module 301. Accordingly, the glass substrate G becomes the upper side.

After flipping in the flip chamber 108, the transport mode of the transport carrier 302 is switched again from the magnetic levitation transport mode to the roller transport mode. Subsequently, the transport carrier 302 is transported to the glass substrate unloading chamber 109 at the substrate unloading position P4 through roller transport. At the substrate unloading position P4, the mask chucks are released from the glass substrate G and the glass substrate G is transported to the next process through an unloading mechanism which is not shown.

The transport carrier 302 in a vacant state from which the glass substrate G has been unloaded therefrom in the glass substrate unloading chamber 109 rotates along with the transport module 301 90° counterclockwise in the figure. Accordingly, the glass substrate unloading chamber 109 includes a direction change mechanism for rotating the transport module in the plane direction. Subsequently, the transport carrier 302 is transferred from the transport module 301 to the carrier shifter 100d and transported to the carrier transfer position P5 that is the start point of the return transport path 100b. On the other hand, the transport module 301 after the transport carrier 302 has been transferred to the carrier shifter 100d rotates 90° clockwise to return in the original direction. Accordingly, the transport module 301 returns to a state in which it can receive the next transport carrier unloaded from the flip chamber 108.

The carrier shifter 100d has the same transport mechanism as the transport module 301. The carrier shifter 100d receives the vacant transport carrier 302 from which the substrate has been unloaded from the transport module 301 which has rotated 90° in the glass substrate unloading chamber 109 and transfers the vacant transport carrier 302 in the direction change mechanism 110 (transport module for direction change) disposed at the start point (carrier transfer position P5) of the return transport path 100b. The direction change mechanism 110 rotates the transport carrier 90° counterclockwise in the planar view and transports it to a transport module constituting the return transport path 100b. After completion of transport, the direction change mechanism 110 rotates 90° clockwise to return to the original position and switches to a state in which it can receive the next transport carrier from the carrier shifter 100d.

Return Process

The transport carrier 302 moves on the return transport path in the roller transport mode. A rotation supporting mechanism rotates the transport carrier 302 180° in the progress direction together with the transport module in the flip chamber 111. Accordingly, the transport carrier 302 is loaded at the mask transfer position P6 in a state in which the mask mounting surface of the electrostatic chuck 308 faces downward. Subsequently, the transport carrier 302 receives the mask M from the mask transfer mechanism 100c, chucks the mask M with the magnetic chuck 307 and holds the mask M with the mask chucks 311. Subsequently, the transport carrier 302 moves in a direction of arrow C in the roller transport mode continuously while holding the mask M with the mask chucks 311.

The transport carrier 302 stops after moving to the mask separation position P7 and releases the mask chucks 311 to separate the mask M. The separated mask M is transferred to the mask transfer mechanism 100e. The mask transfer mechanism 100e roughly aligns the mask M in the pre-alignment chamber 100g between the deposition process transport path 100a and the return transport path 100b and then transports the mask M to the alignment chamber 103.

On the other hand, the transport carrier 302 from which the mask M has been separated in the mask separation position P7 rotates 180° in the progress direction in the flip chamber 113. Accordingly, the glass substrate holding surface of the electrostatic chuck 308 faces upward. Then, the transport carrier 302 rotates 90° clockwise by the direction change mechanism 114 at the carrier return position P8 that is the end point of the return transport path 100b. Subsequently, the transport carrier 302 is transferred to the carrier shifter 100f and transported to the substrate loading chamber 101 at the glass substrate loading position P1 that is the start point of the deposition process transport path 100a. The direction change mechanism 114 rotates 90° counterclockwise to return to the original state after transferring the transport carrier 302. The transport carrier 302 loaded into the substrate loading chamber 101 additionally rotates 90° counterclockwise to return to the initial position at which it can hold the next glass substrate G loaded from the outside.

It is possible to smoothly execute a series of processes for depositing an organic EL light-emitting material on sequentially loaded glass substrates by performing the above-described processing.

In addition, the above-described processing is effective particularly in the deposition chamber and loading/unloading into/from the deposition chamber because generation of dust and particles caused by friction can be curbed by transporting the transport carrier 302 through a magnetic levitation mode. Furthermore, according to the illustrated example, the glass substrate G is simply transported in one direction and it need not be turned by a robot or the like in the planar direction although it needs to be flipped upside down in a progress direction in processes until the glass substrate G is unloaded through alignment and deposition after loaded into the manufacturing line 100. That is, the glass substrate G is transported on the transport path in a linear line. Accordingly, a possibility that dust and particles will be attached to a substrate can be further reduced because there is no need for rotating the glass substrate G with robot and so on within a plane direction.

Moreover, the glass substrate G is loaded into the manufacturing line in a state in which the film formation surface thereof faces upward in the illustrated example. Accordingly, for example, by loading the glass substrate G with setting the surface on which the film is not formed on the supporting apparatus, this is effective for protecting the film formation surface when the glass substrate is mounted on the transport carrier 302.

Here, it is necessary to dispose deposition materials under the glass substrate in the deposition chamber because film formation processing is performed by vaporizing or sublimating the deposition materials in a vacuum through PVD or CVD. Accordingly, it is necessary to control the posture of the glass substrate such that the film formation surface thereof faces downward during deposition. According to the configuration of the present invention, the mask M is lifted toward the film formation surface of the glass substrate G in a state in which the film formation surface of the glass substrate G held by the transport carrier 302 faces downward and mounted on the glass substrate G through an alignment process. Accordingly, the glass substrate is in a posture at which the aforementioned deposition materials can be deposited thereon at the time when the mask M is mounted on the glass substrate.

The electrostatic chuck is used to hold the glass substrate to the transport carrier 302 and the magnetic chuck and the mechanical mask chucks are used to hold the mask. The electrostatic chuck and the magnetic chuck are incorporated into the chuck frame, and the magnetic chuck can switch between a chucked state and a non-chucked state through ascending/descending operations of magnets in the chuck frame. First, a mask is elastically held to the transport carrier 302 having a glass substrate disposed therebetween using the mechanical mask chucks. Thereafter, mask chucking is completed by moving the magnetic chuck downward. According to the configuration of the present invention, these three types of chuck can be compactly incorporated into the transport carrier 302.

The electrostatic chuck control unit which controls the electrostatic chuck of the present invention is housed in the control box along with a rechargeable power supply and wireless communication means for transmitting commands from the control system and incorporated into the transport carrier. Accordingly, it is not necessary to connect a power supply cable, a communication cable and the like to the transport carrier 302 from the outside in manufacturing processes.

In the above-described embodiment, the driving magnets 305*a* and 305*b* are provided on the upper surface of the transport carrier 302 and attracted upward by the driving coils 306*a* and 306*b* arranged to face the driving magnets 305*a* and 305*b* on the transport module 301. However, the arrangement of the magnet unit and the coil unit is not limited thereto, and driving magnets may be disposed on the side of the transport carrier 302 and a plurality of coils may be disposed at positions on the transport modules 301 which face the driving magnets such that the transport carrier 302 is held through magnetic levitation from the side.

According to the present invention, in a state in which the glass substrate G and the mask M are held by the transport carrier 302, the glass substrate G and the mask M are aligned using a magnetic force in a state in which they are levitated through magnetism in the alignment chamber before deposition is performed in the deposition chamber. Accordingly, positioning with high accuracy can be performed. In addition, it is not necessary to provide additional means for alignment because alignment is controlled through a current or a voltage applied to coils serving as transport means of the transport carrier, and thus a simple apparatus can be realized at low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-234923, filed on Dec. 14, 2018, which is hereby incorporated by reference herein in its entirety.

What is claimed is:

1. A deposition apparatus comprising:
a transport mechanism including a transport carrier which holds and transports a substrate, and a plurality of transport modules which constitute a transport path through which the transport carrier moves, the plurality of transport modules being respectively disposed in a plurality of chambers;
an alignment chamber, of the plurality of chambers, in which the substrate held by the transport carrier is loaded and a mask is positioned and fixed to the loaded substrate;
a deposition chamber, of the plurality of chambers, in which the substrate held by the transport carrier is loaded from the alignment chamber and deposition materials are deposited on the loaded substrate; and
a control block configured to control a magnetic force generated between a plurality of magnets arranged in the transport carrier in a transport direction of the substrate and a plurality of coils respectively arranged to face the plurality of magnets in each of the plurality of transport modules by applying a current or a voltage to the plurality of coils,
wherein the control block is configured to switch a transport mode of the transport mechanism between:
(i) a first mode in which the transport carrier transports the substrate by moving in the transporting direction with a driving force in the transporting direction which is generated by a magnetic force between the plurality of magnets arranged in the transport carrier and a first plurality of coils of the plurality of coils in a first transport module of the plurality of transport modules, wherein the transport carrier is in a state in which guide grooves of the transport carrier are not in contact with rollers of the first transport module, and
(ii) a second mode in which the transport carrier transports the substrate by moving in the transporting direction with a driving force in the transporting direction which is generated by a magnetic force between the plurality of magnets arranged in the transport carrier and a second plurality of coils of the plurality of coils in a second transport module of the plurality of transport modules, wherein the transport carrier is in a state in which the transport carrier is supported by rollers of the second transport module which are in contact with the guide grooves of the transport carrier, and
the control block is configured to control, in the alignment chamber, a magnetic force between the plurality of magnets arranged in the transport carrier and a third plurality of coils of the plurality of coils in a third transport module of the plurality of transport modules disposed in the alignment chamber so that position of the transport carrier which holds the substrate is adjusted.

2. The deposition apparatus according to claim 1, wherein the control block is configured to control the transport mechanism in the first mode in the deposition chamber.

3. The deposition apparatus according to claim 1, further comprising:
a flip chamber, of the plurality of chambers, including a fourth transport module of the plurality of transport modules disposed in the flip chamber and flip means which reverses the transport carrier holding the substrate upside down, wherein
the substrate is loaded into the alignment chamber from the flip chamber by the transport mechanism, and
the transport mechanism performs transport in the second mode before reversal of the transport carrier and performs transport in the first mode after reversal of the transport carrier.

4. The deposition apparatus according to claim 3, wherein the flip means reverses the transport carrier upside down together with the fourth transport module.

5. The deposition apparatus according to claim 4, wherein the flip means reverses the transport carrier, holding the substrate with a film formation surface, upside down such that the film formation surface faces downward.

6. The deposition apparatus according to claim 3, further comprising:
a substrate loading chamber, of the plurality of chambers, in which the substrate is loaded and held by the transport carrier and then unloaded to the flip chamber, wherein a deposition process transport path including the substrate loading chamber, the flip chamber, the alignment chamber, and the deposition chamber is disposed in a linear form.

7. The deposition apparatus according to claim 6, wherein the transport carrier holds the substrate, moves through the deposition process transport path, discharges the substrate on which deposition has been performed, and then returns to the substrate loading chamber through a return transport path constituting a circulation type transport path along with the deposition process transport path.

8. The deposition apparatus according to claim 1, wherein the rollers of the second transport module are disposed in the transport direction, the guide grooves are formed in the transport carrier in the transport direction, and the transport carrier is transported in the second transport module with the rollers of the second transport module being inserted into and supported by the guide grooves of the transport carrier in the second mode.

9. The deposition apparatus according to claim 8, wherein the guide grooves of the transport carrier are formed to be paired on left and right sides with respect to the transport direction of the transport carrier, and
the plurality of magnets arranged in the transport carrier are arranged to form a plurality of magnet arrays paired on left and right sides with respect to the transport direction of the transport carrier.

10. An electronic device manufacturing apparatus which manufactures an electronic device by forming films on the substrate using the deposition apparatus according to claim 1.

11. The deposition apparatus according to claim 1, wherein
the guide grooves of the transport carrier include a first guide groove and a second guide groove, the first guide groove including a first upper surface and a first lower surface facing the first upper surface with a first gap therebetween, and the second guide groove including a second upper surface and a second lower surface facing the second upper surface with a second gap therebetween, and
the rollers of the first transport module include a first plurality of rollers and a second plurality of rollers, the first plurality of rollers being configured to be disposed directly in the first gap between the first upper surface and the first lower surface of the first guide groove, and the second plurality of rollers being configured to be disposed directly in the second gap between the second upper surface and the second lower surface of the second guide groove.

12. The deposition apparatus according to claim 11, wherein in the first mode in which the transport carrier transports the substrate by moving in the transporting direction with the driving force in the transporting direction which is generated by the magnetic force between the plurality of magnets arranged in the transport carrier and the first plurality of coils in the first transport module, the first plurality of rollers are disposed directly in the first gap between the first upper surface and the first lower surface of the first guide groove with the first plurality of rollers being spaced apart from both of the first upper surface and the first lower surface of the first guide groove, and the second plurality of rollers are disposed directly in the second gap between the second upper surface and the second lower surface of the second guide groove with the second plurality of rollers being spaced apart from both of the second upper surface and the second lower surface of the second guide groove.

13. The deposition apparatus according to claim 12, wherein
the rollers of the second transport module include a third plurality of rollers and a fourth plurality of rollers, the third plurality of rollers being configured to be disposed directly in the first gap between the first upper surface and the first lower surface of the first guide groove, and the fourth plurality of rollers being configured to be disposed directly in the second gap between the second upper surface and the second lower surface of the second guide groove, and
in the second mode in which the transport carrier transports the substrate by moving in the transporting direction with the driving force in the transporting direction which is generated by the magnetic force between the plurality of magnets arranged in the transport carrier and the second plurality of coils in the second transport module, the third plurality of rollers are disposed directly in the first gap between the first upper surface and the first lower surface of the first guide groove with the third plurality of rollers contacting the first upper surface of the first guide groove while being spaced apart from the first lower surface of the first guide groove, and the fourth plurality of rollers are disposed directly in the second gap between the second upper surface and the second lower surface of the second guide groove with the fourth plurality of rollers contacting the second upper surface of the second guide groove while being spaced apart from the second lower surface of the second guide groove.

14. The deposition apparatus according to claim 13, wherein the plurality of magnets arranged in the transport carrier extend in the transport direction of the substrate such that a first plurality of magnets extending in the transport direction are disposed above a first position where the first guide groove is formed, and a second plurality of magnets extending in the transport direction are disposed above a second position where the second guide groove is formed.

15. The deposition apparatus according to claim 14, wherein the first plurality of magnets extending in the transport direction are disposed, in a direction perpendicular to the transport direction, directly above the first position where the first guide groove is formed, and the second plurality of magnets extending in the transport direction are disposed, in the direction perpendicular to the transport direction, directly above the second position where the second guide groove is formed.

* * * * *